(12) United States Patent
Sumita

(10) Patent No.: US 7,675,769 B2
(45) Date of Patent: Mar. 9, 2010

(54) SEMICONDUCTOR INTEGRATED CIRCUIT

(75) Inventor: Masaya Sumita, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/980,547

(22) Filed: Oct. 31, 2007

(65) Prior Publication Data
US 2008/0062779 A1 Mar. 13, 2008

Related U.S. Application Data

(62) Division of application No. 10/567,688, filed as application No. PCT/JP2005/010473 on Jun. 8, 2005, now Pat. No. 7,304,883.

(30) Foreign Application Priority Data

Jun. 9, 2004 (JP) ............................. 2004-171853
Feb. 4, 2005 (JP) ............................. 2005-028766

(51) Int. Cl.
G11C 11/00 (2006.01)
(52) U.S. Cl. ............. 365/154; 365/189.03; 365/189.14; 365/221
(58) Field of Classification Search ................. 365/154, 365/189.03, 189.14, 221
See application file for complete search history.

(56) References Cited

U.S. PATENT DOCUMENTS 4,942,521 A 7/1990 Hanawa et al.
4,947,373 A 8/1990 Yamaguchi et al.
5,007,051 A 4/1991 Dolkas et al.
5,043,878 A 8/1991 Ooi
5,043,935 A 8/1991 Taniai et al.
5,434,818 A * 7/1995 Byers et al. ............ 365/189.04

(Continued)

FOREIGN PATENT DOCUMENTS

JP 5-334267 12/1993

(Continued)

OTHER PUBLICATIONS

Nose et al., "Optimization of $V_{DD}$ and $V_{TH}$ for Low-Power and High-Speed Applications", ASPDAC.00, pp. 469-474, Jan. 2000.

Primary Examiner—Thong Q Le
(74) Attorney, Agent, or Firm—McDermott Will & Emery LLP

(57) ABSTRACT

In a semiconductor integrated circuit having a register file of a multiport configuration, a first holding circuit 20A is dedicated to a first functional block having one first write port section 21AW and two first read port sections 21AR1 and 21AR2. A second holding circuit 30B is dedicated to a second functional block having one second write port section 31AW and one second read port section 31BR. When it is necessary to read data held in the first holding circuit 20A from the second read port section 31BR, for example, a data interchange operation is performed as follows. After the data of the second holding circuit 30B is latched in a latch circuit 40, the data of the first holding circuit 20A is transferred to the second holding circuit 30B, and then the data of the second holding circuit 30B latched in the latch circuit 40 is transferred to the first holding circuit 20A. Thus, the area necessary to provide a register file is significantly reduced.

36 Claims, 21 Drawing Sheets

U.S. PATENT DOCUMENTS

| | | | |
|---|---|---|---|
| 5,477,489 A * | 12/1995 | Wiedmann | 365/189.04 |
| 5,959,931 A * | 9/1999 | Ueda | 365/230.05 |
| 6,317,367 B1 * | 11/2001 | Sample et al. | 365/189.08 |
| 6,430,083 B1 | 8/2002 | Lu et al. | |
| 6,608,775 B2 | 8/2003 | Lu et al. | |
| 6,611,904 B1 * | 8/2003 | Uguen | 365/189.04 |
| 6,614,710 B2 * | 9/2003 | Song et al. | 365/230.03 |
| 6,795,368 B2 * | 9/2004 | Iwahashi et al. | 365/230.05 |
| 7,170,812 B2 * | 1/2007 | Nii | 365/227 |
| 7,394,717 B2 * | 7/2008 | Hidaka | 365/230.03 |
| 2002/0006072 A1 * | 1/2002 | Kunikiyo | 365/230.05 |
| 2002/0060938 A1 * | 5/2002 | Song et al. | 365/200 |

FOREIGN PATENT DOCUMENTS

| | | |
|---|---|---|
| JP | 6-60656 | 3/1994 |
| JP | 9-198870 | 7/1997 |
| JP | 11-175394 | 7/1999 |

\* cited by examiner

FIG. 4

| | ACTIVITY RATE (ACCESS FREQUENCY) | THRESHOLD VOLTAGE | POWER SOURCE VOLTAGE |
|---|---|---|---|
| FIRST WRITE PORT SECTION 21AW | 1/32 | 200mV | 1.0V |
| SECOND WRITE PORT SECTION 31BW | 1/1000 | 400mV | 0.8V |
| FIRST READ PORT SECTION 21AR1 | 1/32 | 200mV | 1.0V |
| FIRST READ PORT SECTION 21AR2 | 1/32 | 200mV | 1.0V |
| SECOND READ PORT SECTION 31BR | 1/1000 | 400mV | 0.8V |
| FIRST HOLDING CIRCUIT 20A | 1/32 | 200mV | 1.0V |
| FIRST HOLDING CIRCUIT 20B | 1/1000 | 400mV | 0.8V |
| LATCH CIRCUIT 40C | 1/10000 | 500mV | 0.75V |

FIG. 13

| | ACTIVITY RATE (ACCESS FREQUENCY) | THRESHOLD VOLTAGE | POWER SOURCE VOLTAGE |
|---|---|---|---|
| MCA WRITE PORT | 1/32 | 200mV | 0.8V |
| MCB WRITE PORT | 1/1000 | 400mV | 1V |
| MCA READ PORT | 1/32 | 200mV | 0.8V |
| MCB READ PORT | 1/1000 | 400mV | 1V |
| MCA HOLDING CIRCUIT | 1/32 | 200mV | 0.8V |
| MCB HOLDING CIRCUIT | 1/1000 | 400mV | 1V |
| LATCH CIRCUIT | 1/10000 | 400mV | 1V |

FIG. 14C  ⊣▨ = ⊣┠ HVt (=400mV) VBNC

FIG. 14D  ⊣▨ = ⊣┠ LVt (=200mV) VBN

FIG. 14E  ▷∘ = ┤┠ VDDC (=1V)

FIG. 14F  ▷∘ = ┤┠ VDD (=0.8V)

ent Ser. No. 10/567,688, filed Feb. 9, 2006, now U.S. Pat. No. 7,304,883 that is based on the U.S. National Phase under 35 U.S.C. § 371 of International Application No. PCT/JP2005/010473, filed Jun. 8, 2005, which in turn claims the benefit of Japanese Application No. 2004-171853, filed Jun. 9, 2004 and Japanese Application No. 2005-028766, filed Feb. 4, 2005, the disclosures of which Applications are incorporated by reference herein in their entirety.

TECHNICAL FIELD

The present invention relates to a semiconductor integrated circuit and, more particularly, to the configuration of a register file with multiple ports.

BACKGROUND ART

In a conventional semiconductor integrated circuit having a multiport register file, a plurality of functional blocks are connected to the multiport register file so that the functional blocks can process data in parallel.

For example, Patent Document 1 uses a register file of a multiport type where the number of write ports is 2 and the number of read ports is also 2 (2-Write 2-Read (2W2R)-type), wherein a 1W1R-type functional block and another 1W1R-type functional block are connected to the 2W2R port-type register file. Specifically, the 2W2R port-type register file provides two read ports and two write ports for one memory cell, wherein one read port and one write port are connected to a first functional block while the other read port and the other write port are connected to a second functional block.

It has been disclosed in Non-Patent Document 1, for example, that for such a transistor circuit including memory cells, there is a relationship between the threshold voltage of constituent transistors, the supply voltage to the constituent transistors, the activity rate of the constituent transistors and the power consumption thereof, i.e., there exist a threshold voltage and a supply voltage that minimize the power consumption under any given activity rate.

Patent Document 1: Japanese Laid-Open Patent Publication No. 11-175394 (FIG. 13)

Non-Patent Document 1: K. Nose et al., Optimization of VDD and VTH for low-power and high-speed applications, ASPDAC.00, pp. 469-474, January 2000.

DISCLOSURE OF THE INVENTION

Problems to be Solved by the Invention

However, the conventional semiconductor integrated circuit having a multiport type register file has the following problems.

As described above, in a conventional multiport type register file, there are provided, for one memory cell, the same number of ports as the total number of write and read ports of a plurality of functional blocks connected thereto. Therefore, the multiport type register file has an increased area.

Moreover, in a case where, for example, one functional block connected thereto has a high activity rate (access frequency) and another functional block connected thereto has a low activity rate in the conventional multiport type register file, although there exist a supply voltage and a transistor threshold voltage that optimize, to minimum, the power consumption under one activity rate, the supply voltage and the threshold voltage are not optimal values when using the memory cell with the other activity rate, thereby failing to minimize the power consumption and thus wasting power.

In view of this, one possible approach is to, for example, employ a configuration where dedicated memory cells are used in each functional block, instead of employing a conventional configuration where memory cells are shared among a plurality of functional blocks. With this approach, for each memory cell dedicated to a functional block, it is possible to set a supply voltage and a threshold voltage corresponding to the activity rate of the functional block, whereby it is possible to effectively reduce the power consumption. Moreover, it is only required to provide each memory cell dedicated to a functional block with the same number of ports as the total number of read and write ports of the functional block, whereby it is possible to reduce the number of ports by the number of ports of the other functional blocks, thereby reducing the area.

With this approach, however, if data needed by a functional block is not stored in a memory cell dedicated thereto but in another memory cell dedicated to a different functional block, it is necessary to relocate the data to the memory cell dedicated to the first functional block and then read the data from the memory cell dedicated to the first functional block. In this case, one possible approach is to, for example, employ a configuration where data already stored in the dedicated memory cell of the first functional block is once saved to an external register, after which the data is transferred from the dedicated memory cell of the second functional block to the dedicated memory cell of the first functional block. This approach, however, requires external save registers, data buses connected thereto, etc., thereby requiring an amount of time for accessing data and increasing the area. Moreover, the minute process has come to a point where the gate length is on the order of ten nanometers, thereby showing problems, including the limit of lithography and the increase in the leak current due to the quantum effect.

In view of these problems, an object of the present invention is to provide a semiconductor integrated circuit having a multiport type register file, which is capable of accessing data within a short time while reducing the number of ports required for one memory cell.

Means for Solving the Problems

In order to achieve the object set forth above, the present invention basically employs a configuration where dedicated memory cells are used for each functional block, wherein if a functional block needs data of dedicated memory cells of another functional block, a data interchange operation between memory cells is performed in a memory cell array.

Specifically, a semiconductor integrated circuit of the present invention includes: first and second information holding circuits formed in a memory cell array for holding information; a first port section for inputting or outputting information, which is connected only to the first information holding circuit; a second port section for inputting or outputting information, which is connected only to the second information holding circuit; and an interchange circuit receiving an interchange control signal for interchanging, in the memory cell array, information held in the first information holding circuit and information held in the second information holding circuit with each other.

In one embodiment, the present invention provides a semiconductor integrated circuit as set forth above, wherein: the first and second port sections are each formed by a transistor circuit; and the transistor circuit of the first port section is formed by transistors of a threshold voltage and the transistor circuit of the second port section is formed by transistors of a different threshold voltage.

In one embodiment, the present invention provides a semiconductor integrated circuit as set forth above, wherein: an access frequency of the first port section and that of the second port section are different from each other; and the access frequency of the port section formed by transistors of a higher threshold voltage is lower than that of the port section formed by transistors of a lower threshold voltage.

In one embodiment, the present invention provides a semiconductor integrated circuit as set forth above, wherein a power source voltage supplied to the first port section and that supplied to the second port section are different from each other.

In one embodiment, the present invention provides a semiconductor integrated circuit as set forth above, wherein an access frequency of the port section of a lower power source voltage is lower than that of the port section of a higher power source voltage.

In one embodiment, the present invention provides a semiconductor integrated circuit as set forth above, wherein: the first and second information holding circuits are each formed by a transistor circuit; and the transistor circuit of the first information holding circuit is formed by transistors of a threshold voltage and the transistor circuit of the second information holding circuit is formed by transistors of a different threshold voltage.

In one embodiment, the present invention provides a semiconductor integrated circuit as set forth above, wherein an access frequency of the information holding circuit formed by transistors of a higher threshold voltage is lower than that of the information holding circuit formed by transistors of a lower threshold voltage.

In one embodiment, the present invention provides a semiconductor integrated circuit as set forth above, wherein a power source voltage supplied to the first information holding circuit and that supplied to the second information holding circuit are different from each other.

In one embodiment, the present invention provides a semiconductor integrated circuit as set forth above, wherein an access frequency of the information holding circuit of a lower power source voltage is lower than that of the information holding circuit of a higher power source voltage.

In one embodiment, the present invention provides a semiconductor integrated circuit as set forth above, wherein: the interchange circuit includes a temporary holding circuit for temporarily holding information; and information held in the first information holding circuit and information held in the second information holding circuit are interchanged with each other via the temporary holding circuit based on the interchange control signal.

In one embodiment, the present invention provides a semiconductor integrated circuit as set forth above, wherein a completion of an interchange operation in which information held in the first information holding circuit and information held in the second information holding circuit are interchanged with each other is detected, upon which an output of the interchange control signal is stopped.

In one embodiment, the present invention provides a semiconductor integrated circuit as set forth above, wherein a completion of an operation in which information that should be held in the first and second information holding circuits are held in the first and second information holding circuits is detected, after which the information held in the first information holding circuit and the information held in the second information holding circuit are interchanged with each other.

In one embodiment, the present invention provides a semiconductor integrated circuit as set forth above, wherein: the first and second port sections are each formed by a transistor circuit; each of the transistor circuits of the first and second port sections is formed by transistors of a transistor width according to an access speed of the port section; and the transistor width of the transistor circuit of the port section of a lower access speed is smaller than that of the transistor circuit of the port section of a higher access speed.

In one embodiment, the present invention provides a semiconductor integrated circuit as set forth above, wherein: the first and second information holding circuits are each formed by a transistor circuit; each of the transistor circuits of the first and second information holding circuits is formed by transistors of a transistor width according to an access speed of the port section that is connected to the information holding circuit; and the transistor width of the transistor circuit of the information holding circuit of a lower access speed is smaller than that of the transistor circuit of the information holding circuit of a higher access speed.

In one embodiment, the present invention provides a semiconductor integrated circuit as set forth above, wherein the temporary holding circuit is formed by a latch circuit.

In one embodiment, the present invention provides a semiconductor integrated circuit as set forth above, wherein the latch circuit is a differential circuit.

In one embodiment, the present invention provides a semiconductor integrated circuit as set forth above, wherein the interchange circuit includes a latch circuit for temporarily holding information held in the information holding circuit of a lower power source voltage and outputting the held information to the information holding circuit of a higher power source voltage.

In one embodiment, the present invention provides a semiconductor integrated circuit as set forth above, wherein: the first and second port sections and the first and second information holding circuits are each formed by a transistor circuit; a group including the first port section and the first information holding circuit and a group including the second port section and the second information holding circuit each include a substrate voltage control circuit; and the substrate voltage control circuit of each group controls a threshold voltage of transistors forming the transistor circuits of the port section and the information holding circuit of the group to a threshold voltage according to an access frequency of the port section of the group.

In one embodiment, the present invention provides a semiconductor integrated circuit as set forth above, wherein: a group including the first port section and the first information holding circuit and a group including the second port section and the second information holding circuit each include a power source voltage control circuit; and the power source voltage control circuit of each group controls a power source voltage supplied to the port section and the information holding circuit of the group according to an information read time and an information write time for the port section of the group.

In one embodiment, the present invention provides a semiconductor integrated circuit as set forth above, wherein: the first and second port sections and the first and second information holding circuits are each formed by a transistor circuit; a group including the first port section and the first information holding circuit and a group including the second port section and the second information holding circuit each include a substrate voltage control circuit and a power source voltage control circuit; the substrate voltage control circuit of each group controls a threshold voltage of transistors of the transistor circuits of the port section and the information holding circuit of the group to a predetermined threshold voltage; and the power source voltage control circuit of each group controls a power source voltage supplied to the port section and the information holding circuit of the group so as to control an information read time and an information write time for the port section of the group to respective predetermined times.

In one embodiment, the present invention provides a semiconductor integrated circuit as set forth above, wherein: the first and second port sections and the first and second information holding circuits are formed in a transistor parallel portion including a plurality of transistors arranged in parallel to one another; the port section and the information holding circuit of a lower operating speed are located in an edge portion of the transistor parallel portion; and the port section and the information holding circuit of a higher operating speed are located in an inner portion of the transistor parallel portion.

In one embodiment, the present invention provides a semiconductor integrated circuit as set forth above, wherein: the semiconductor integrated circuit includes first and second dummy information holding circuits formed in a cell array in which the first and second information holding circuits are formed; and the interchange control signal takes into account a interchange time required before information held in the first and second dummy information holding circuits are actually interchanged with each other, and an output of the interchange control signal is stopped after elapse of the interchange time.

In one embodiment, the present invention provides a semiconductor integrated circuit as set forth above, wherein a substrate in which the first port section is formed is separated from a substrate of the second port section.

In one embodiment, the present invention provides a semiconductor integrated circuit as set forth above, wherein a substrate in which the first information holding circuit is formed is separated from a substrate of the second information holding circuit.

In one embodiment, the present invention provides a semiconductor integrated circuit as set forth above, wherein the temporary holding circuit is formed by a transistor circuit, and a threshold value of transistors forming the transistor circuit is set to a threshold value according to an access frequency of the interchange control signal.

In one embodiment, the present invention provides a semiconductor integrated circuit as set forth above, wherein a power source voltage supplied to the temporary holding circuit is set to a voltage according an access frequency of the interchange control signal.

In one embodiment, the present invention provides a semiconductor integrated circuit as set forth above, wherein: an access speed of the first and second port sections is a predetermined speed; and an access frequency of the port section of a lower power source voltage is higher than that of the port section of a higher power source voltage.

In one embodiment, the present invention provides a semiconductor integrated circuit as set forth above, wherein an access frequency of the information holding circuit of a lower power source voltage is higher than that of the information holding circuit of a higher power source voltage.

In one embodiment, the present invention provides a semiconductor integrated circuit as set forth above, wherein: a power source voltage of the interchange circuit is higher than that of the information-inputting port section of a lower power source voltage; and the interchange circuit includes a latch circuit for temporarily holding information held in the information holding circuit connected to the information-inputting port section of a higher power source voltage and outputting the held information to the information holding circuit connected to the information-inputting port section of a lower power source voltage.

In one embodiment, the present invention provides a semiconductor integrated circuit as set forth above, wherein: the temporary holding circuit is formed by a first inversion circuit and a second inversion circuit; an output of the first inversion circuit is connected to an input of the second inversion circuit; the second inversion circuit includes first and second NMOS transistors connected in series with each other; an input of the first inversion circuit is connected to an output of a first information-inputting port section, an output of a second information-inputting port section, and a drain of a first NMOS transistor of the second inversion circuit; the first NMOS transistor of the second inversion circuit has a gate connected to an output of the first inversion circuit and a source connected to a drain of the second NMOS transistor; and an output from the first or second information-inputting port section is input to a gate of the second NMOS transistor of the second inversion circuit.

In one embodiment, the present invention provides a semiconductor integrated circuit as set forth above, wherein: the number of the first or second information-inputting port sections is one; and a source of the second NMOS transistor of the second inversion circuit receives an inverted signal of a signal from the first or second information-inputting port section.

In one embodiment, the present invention provides a semiconductor integrated circuit as set forth above, wherein: the number of the first or second information-inputting port sections is more than one; the number of the second NMOS transistors of the second inversion circuit is equal to the number of the first or second port sections; the plurality of second NMOS transistor are connected in series with one another, and a source of one of the second NMOS transistors that is farthest away from the first NMOS transistor of the second inversion circuit is grounded; and a gate of each of the plurality of second NMOS transistors receives a signal from a corresponding one of the first or second port sections.

In one embodiment, the present invention provides a semiconductor integrated circuit as set forth above, wherein a signal from one of the first or second information-inputting port sections that has a high activity rate is input to a gate of the second NMOS transistor that is farthest away from the first NMOS transistor of the second inversion circuit.

In one embodiment, the present invention provides a semiconductor integrated circuit as set forth above, including: a first dummy circuit for reading data from the first information holding circuit and then writing data thereto, and performing a data interchange operation between the first and second information holding circuits; and a second dummy circuit for reading data from the second information holding circuit and then writing data thereto, and performing a data interchange operation between the first and second information holding circuits, wherein: a plurality of MOS transistors of the first dummy circuit all have the same MOS property, the MOS property being a diffusion layer concentration, a substrate voltage or a gate oxide film; some of a plurality of MOS transistors of the second dummy circuit have the same MOS property as that of the MOS transistors of the first dummy circuit, and the other MOS transistors of the second dummy circuit have a MOS property different from that of the MOS transistors of the first dummy circuit; the semiconductor integrated circuit includes a power source voltage adjustment circuit for adjusting power source voltages supplied to the first and second dummy circuits, wherein: the power source voltage adjustment circuit adjusts the power source voltage value for the first dummy circuit so as to control a delay value of an output signal from the first dummy circuit to a predetermined first reference delay value, and supplies the adjusted power source voltage value to some of the MOS transistors of the second dummy circuit having the same MOS property as that of the first dummy circuit; and the power source voltage adjustment circuit adjusts the power source voltage value for some of the MOS transistors of the second dummy circuit having a MOS property different from that of the MOS transistors of the first dummy circuit so as to control a delay value of an output signal from the second dummy circuit to a predetermined second reference delay value.

In one embodiment, the present invention provides a semiconductor integrated circuit as set forth above, wherein: the first and second port sections and the first and second information holding circuits are each formed by a transistor circuit; a group including the first port section and the first information holding circuit and a group including the second port section, the second information holding circuit and the interchange circuit each have a power source voltage supply circuit for supplying a power source voltage of a different value; and a power source voltage value of the power source voltage supply circuit of each group is set to such a power source voltage value that a total sum of an information read time, an information write time and an information interchange time in a port section of the group is equal to a predetermined time.

In one embodiment, the present invention provides a semiconductor integrated circuit as set forth above, wherein the semiconductor integrated circuit is a multi-thread processor.

As described above, in the semiconductor integrated circuit of the present invention, the first information holding circuit is basically dedicated to the first port section, and the second information holding circuit is basically dedicated to the second port section, whereby the number of ports for each of these information holding circuits is reduced by the number of port sections other than the port section to which the information holding circuit is dedicated to. Moreover, when it is necessary for the second port section to read out information of the first information holding circuit, for example, the information of the first information holding circuit is relocated to the second information holding circuit by the interchange circuit in the memory cell array, whereby the information access speed is higher and the information can be accessed in a shorter amount of time as compared with a case where the information interchange operation is performed by providing an external save register, or the like.

Moreover, the information of the first information holding circuit is always read/written from/to the first port section dedicated thereto, whereby for the first information holding circuit and the first port section, the power source voltage supplied thereto and the threshold voltage of constituent transistors thereof can be set to appropriate values according to the access frequency (activity rate) of the dedicated first port section, and it is therefore possible to optimize, to minimum, the power consumption of the first information holding circuit and the first port section. This similarly applies also to the second information holding circuit and the second port section.

Furthermore, according to the present invention, an information interchange operation between two information holding circuits is performed via a latch circuit. In this operation, the information of the information holding circuit operating at a lower power source voltage is latched in the latch circuit, and then output to the information holding circuit operating at a higher power source voltage, whereby the information of the information holding circuit of a lower power source voltage can desirably be relocated to the information holding circuit of a higher power source voltage. Therefore, there is no problem for the information holding circuit of a lower power source voltage even if the power source voltage is a low voltage.

In addition, according to the present invention, a port section and an information holding circuit of a lower operating speed are located in an edge portion of a transistor parallel portion where the transistor performance may deteriorate due to a strong influence of the STI (Shallow Trench Isolation: device separation region), and an port section and an information holding circuit of a higher operating speed are located in an inner portion of the transistor parallel portion where there is only a small influence of the STI, whereby the high operating speed and the stability of the port section and the information holding circuit of a higher operating speed are desirably ensured.

In addition, according to the present invention, an information interchange operation between two information holding circuits is performed while taking into account, the actual information interchange time between two dummy information holding circuits formed in the memory cell array, whereby an information interchange operation can be performed reliably between information holding circuits and it is possible to realize a stable operation without being substantially influenced by the external environmental factors such as the production process variations, the temperature and the voltage.

Furthermore, according to the present invention, when HI data is written to the temporary holding circuit, the gate length of the first NMOS transistor of the second inversion circuit does not need to be set to a large value in order to reduce the saturated current but may be set to a small value, whereby it is possible to reduce the area, and an area overhead is not caused even with advanced minute production processes because it is not necessary to form the first NMOS transistor by serially connecting a plurality of transistors of a short gate length. In addition, since the first and second NMOS transistors are connected in series, the sub-threshold leak can be reduced by the DIBL effect.

Moreover, according to the present invention, there is provided a structure with a series of three transistors in which two NMOS transistors in the second inversion circuit and an NMOS transistor of the inversion circuit for the signal of the information-inputting port section, whereby the leak current of the second inversion circuit is further reduced to $\frac{1}{10}$.

Furthermore, according to the present invention, there are more than one information-inputting port sections, and the number of NMOS transistors provided in the second inversion circuit is further increased, where they are connected in series, whereby the leak current is further reduced.

In addition, according to the present invention, it is possible to set, to a low value, the source-drain voltage of an NMOS transistor whose gate potential is at L with a higher probability in the second inversion circuit, whereby it is possible to reduce the gate leak current.

Moreover, according to the present invention, it is possible to supply an appropriate power source voltage to a dummy circuit formed by MOS transistors having predetermined MOS properties and to supply an appropriate power source voltage to another dummy circuit formed by these MOS transistors and other MOS transistors having different MOS properties, whereby the power consumption can be reduced.

Effects of the Invention

As described above, with the semiconductor integrated circuit of the present invention, each port section is connected only to an information holding circuit dedicated thereto, whereby it is possible to significantly reduce the number of ports of each information holding circuit. When it is necessary for a port section to read out information from an information holding circuit other than the information holding circuit dedicated thereto, information of the other information holding circuit can be relocated to the information holding circuit dedicated thereto by an interchange circuit provided in the memory cell array, whereby the information access speed can be kept high and the information can be accessed in a short amount of time. Furthermore, for each group including a port section and an information holding circuit dedicated to the port section, the power source voltage and the threshold voltage of constituent transistors can be set to appropriate values according to the access frequency (activity rate) of the port section of the group, thereby providing an effect of reducing the power consumption of each group.

Furthermore, according to the present invention, the power source voltage for the information holding circuit of a lower power source voltage can be reduced while ensuring that the information of the information holding circuit of a lower power source voltage can desirably be relocated to the information holding circuit of a higher power source voltage.

In addition, according to the present invention, a port section and an information holding circuit of a higher operating speed are located in an inner portion of the transistor parallel portion that is less influenced by the STI, whereby the high operating speed and the stability thereof can desirably be ensured.

In addition, according to the present invention, an information interchange operation between two information holding circuits is performed while taking into account the actual information interchange time between dummy information holding circuits, whereby an information interchange operation can be performed reliably between information holding circuits and it is possible to realize a stable operation without being substantially influenced by the external environmental factors such as the production process variations, the temperature and the voltage.

In addition, according to the present invention, it is possible to reduce the area of the temporary holding circuit, and it is possible to suppress the occurrence of an area overhead even with advanced minute production processes. Furthermore, the sub-threshold leak can be reduced by the DIBL effect.

Moreover, according to the present invention, the leak current of the second inversion circuit can be further reduced.

Furthermore, according to the present invention, appropriate power source voltages can be supplied to dummy circuits of MOS transistors with different predetermined MOS properties, whereby the power consumption can be reduced.

BRIEF DESCRIPTION OF THE DRAWINGS

FIG. 4 shows the relationship between the activity rate, the threshold voltage and the power source voltage of constituent transistors of write port sections, read port sections, holding circuits and a latch circuit of the semiconductor integrated circuit.

FIG. 13 shows the relationship between the activity rate, the threshold voltage and the power source voltage of constituent transistors of write port sections, read port sections, holding circuits and a latch circuit of the semiconductor integrated circuit.

DESCRIPTION OF REFERENCE NUMERALS

Figure 1:
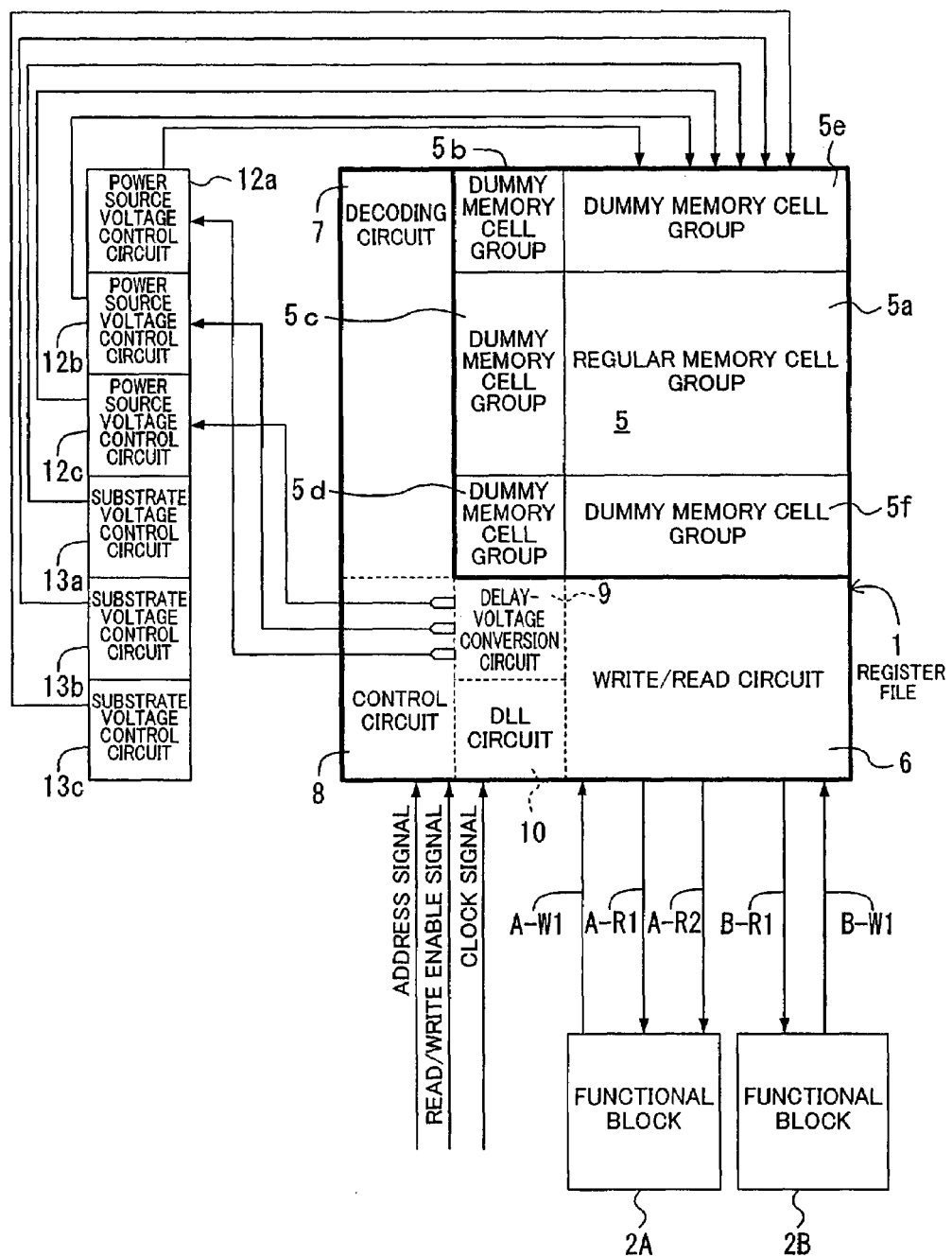
FIG. 1 shows a configuration of a semiconductor integrated circuit according to an embodiment of the present invention.

1 Register file
2A First functional block
2B Second functional block
5 Memory cell array
5a Regular memory cell group
5b to 5f Dummy memory cell group
6 Read/write circuit
7 Decoding circuit
8 Control circuit 9 Delay-voltage conversion circuit
10 DLL circuit
12a to 12c Power source voltage control circuit
13a to 13c Substrate voltage control circuit
20A First holding circuit (first information holding circuit)
20AD1, 20AD2 First dummy holding circuit (first dummy information holding circuit)
30BD1, 30BD2 Second dummy holding circuit (second dummy information holding circuit)
21AW First write port section
21AR1, 21AR2 First read port section
30B Second holding circuit (second information holding circuit)
31AW Second write port section
31AR Second read port section
40 Latch circuit (temporary holding circuit)
41, 42 Transfer circuit
43 Interchange circuit
61 Transistor row
70 Detection circuit
71 Control signal producing circuit
16B MCA dummy circuit (second dummy circuit)
16C MCB dummy circuit (first dummy circuit)
B1L, C1M Power source control circuit (power source voltage adjustment circuit and power source voltage supply circuit)

BEST MODE FOR CARRYING OUT THE INVENTION

A semiconductor integrated circuit according to an embodiment of the present invention will now be described with reference to the drawings.

First Embodiment

FIG. 1 shows a general configuration of a semiconductor integrated circuit according to a first embodiment of the present invention.

In the figure, reference numeral 1 denotes a register file, and reference numerals 2A and 2B each denote a functional block. The register file 1 is of a 2W3R port type where the number of write ports is 2 and the number of read ports is 3. One functional block 2A is of a 1W2R port type where the number of write ports is 1 and the number of read ports is 2, and the other functional block 2B is of a 1W1R port type where the number of write ports and the number of read ports are both 1. Therefore, the register file 1 and one functional block 2A are connected to one write data line A-W1 and two read data lines A-R1 and A-R2, whereas the register file 1 and the other functional block 2B are each connected to one write data line B-W1 and one read data line B-R1.

The register file 1 includes a memory cell array 5, a write/read circuit 6, a decoding circuit 7, a control circuit 8, a delay-voltage conversion circuit 9 and a DLL circuit 10. Moreover, the memory cell array 5 includes a regular memory cell group 5a and five dummy memory cell groups 5b to 5f. These dummy memory cell groups 5b to 5f have the same bit line shape, word line shape and memory cell shape as those of the regular memory cell group 5a. The write/read circuit 6 is connected to the two functional blocks 2A and 2B via the two write data lines A-W1 and B-W1 and the three read data lines A-R1, A-R2 and B-R1. The control circuit 8 receives an address signal, a read enable signal and a write enable signal for writing/reading data to/from the two functional blocks 2A and 2B, and the DLL circuit 10 receives a clock signal.

The semiconductor integrated circuit shown in FIG. 1 further includes three power source voltage control circuits 12a, 12b and 12c and three substrate voltage control circuits 13a, 13b and 13c, the details of which will be described later.

Figure 2:
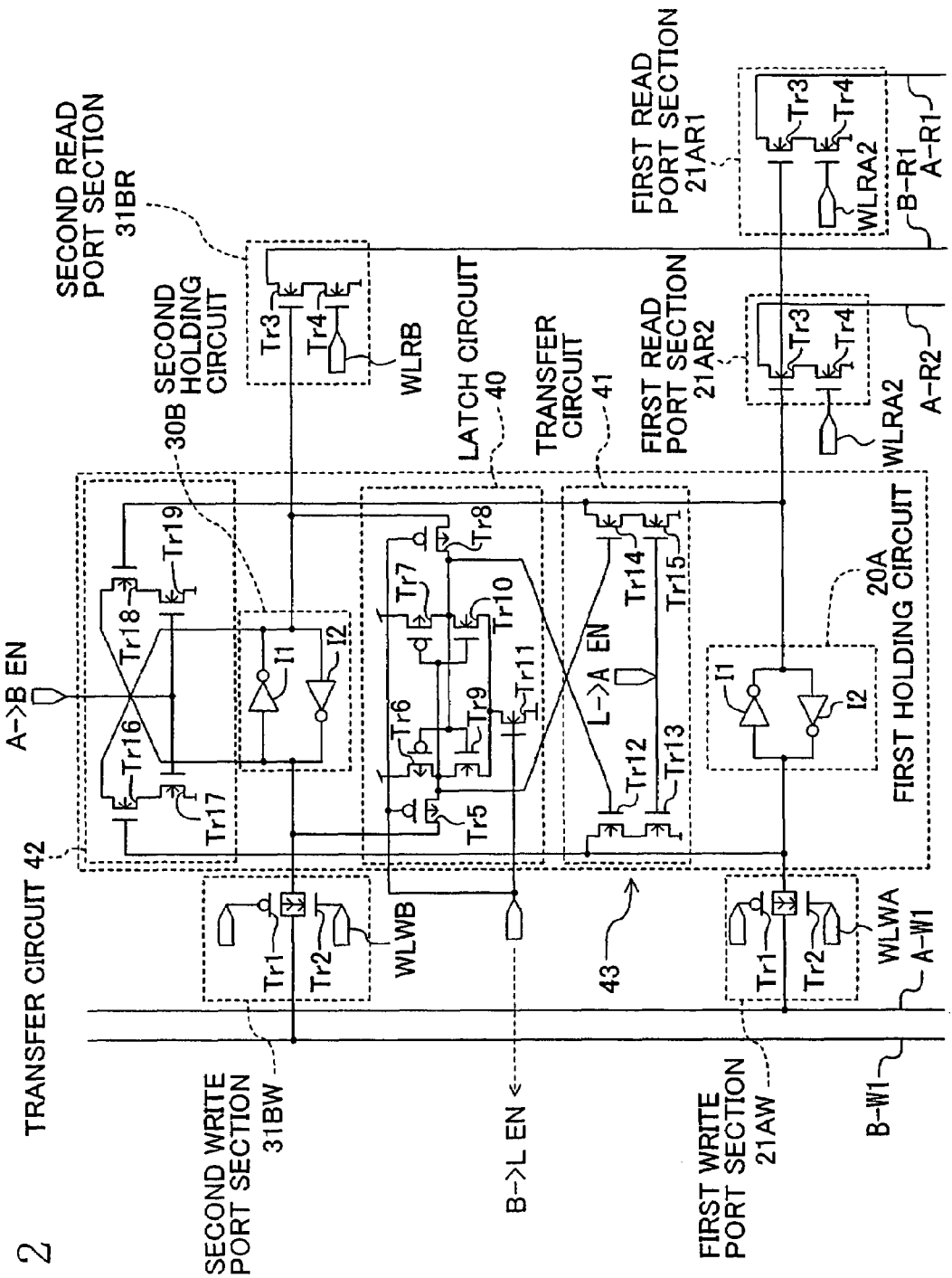
FIG. 2 shows an important part of an internal configuration of a register file of the semiconductor integrated circuit.

FIG. 2 shows the details of the structure for writing/reading data (information) to/from the regular memory cell group 5a. In the figure, reference numeral 20A denotes a first holding circuit (first information holding circuit) dedicated to the 1W2R-type functional block 2A, reference numeral 30B denotes a second holding circuit (second information holding circuit) dedicated to the other 1W1R-type functional block 2B, which each include two inverter circuits I1 and I2. The first holding circuit 20A is connected to one first write port section (information-inputting first port section) 21AW and two first read port sections (information-outputting first port section) 21AR1 and 21AR2, which are dedicated to the 1W2R-type functional block 2A. The first write port section 21AW includes one P-type transistor Tr1 and one N-type transistor Tr2, and is connected to the functional block 2A via the write data line A-W1. Each of the two read port sections 21AR1 and 21AR2 includes two N-type transistors Tr3 and Tr4, and is connected to the functional block 2A via the read data lines A-R1 and A-R2. The gate of the N-type transistor Tr2 of the write port section 21AW is connected to a data write word line WLWA, and the gate of the N-type transistor Tr4 of each read port section 21AR1, 21AR2 is connected to a data read word line WLRA1, WLRA2.

Similarly, the second holding circuit 30B is connected to one second write port section (information-inputting second port section) 31AW and one second read port section (information-outputting second port section) 31AR, which are dedicated to the 1W1R-type functional block 2B. Similarly to the first write port section 21AW, the second write port section 31AW includes one P-type transistor Tr1 and one N-type transistor Tr2, and is connected to the functional block 2B via the write data line B-W1. Similarly to the read port section 21AR1, the read port section 31AR includes two N-type transistors Tr3 and Tr4, and is connected to the functional block 2B via the read data line B-R1. The gate of the N-type transistor Tr2 of the write port section 31AW is connected to a data write word line WLWB, and the gate of the N-type transistor Tr4 of each read port section 31AR is connected to a data read word line WLRB.

Moreover, in FIG. 2, reference numeral 40 denotes a latch circuit (temporary holding circuit) being a differential circuit including four P-type transistors Tr5 to Tr8 and three N-type transistors Tr9 to Tr11. Reference numerals 41 and 42 each denote a transfer circuit including four N-type transistors Tr12 to Tr15, Tr16 to Tr19. The latch circuit 40 is connected to the second holding circuit 30B dedicated to the second functional block 2B, and latches the data held in the second holding circuit 30B when the gate of the N-type transistor Tr11 provided therein receives an H-level control signal B->LEN. One transfer circuit 41 is connected to the latch circuit 40 and the first holding circuit 20A, and transfers the data latched in the latch circuit 40 to the first holding circuit 20A when the gates of the two N-type transistors Tr13 and Tr15 receive a control signal L->AEN. Moreover, the other transfer circuit 42 is connected to the first holding circuit 20A and the second holding circuit 30B, and transfers the data latched in the first holding circuit 20A to the second holding circuit 30B when the gates of the two N-type transistors Tr17 and Tr19 receive a control signal A->BEN. Therefore, the latch circuit 40 and the two transfer circuits 41 and 42 together form an interchange circuit 43 for interchanging data between the first and second holding circuits 20A and 30B.

Figure 3:
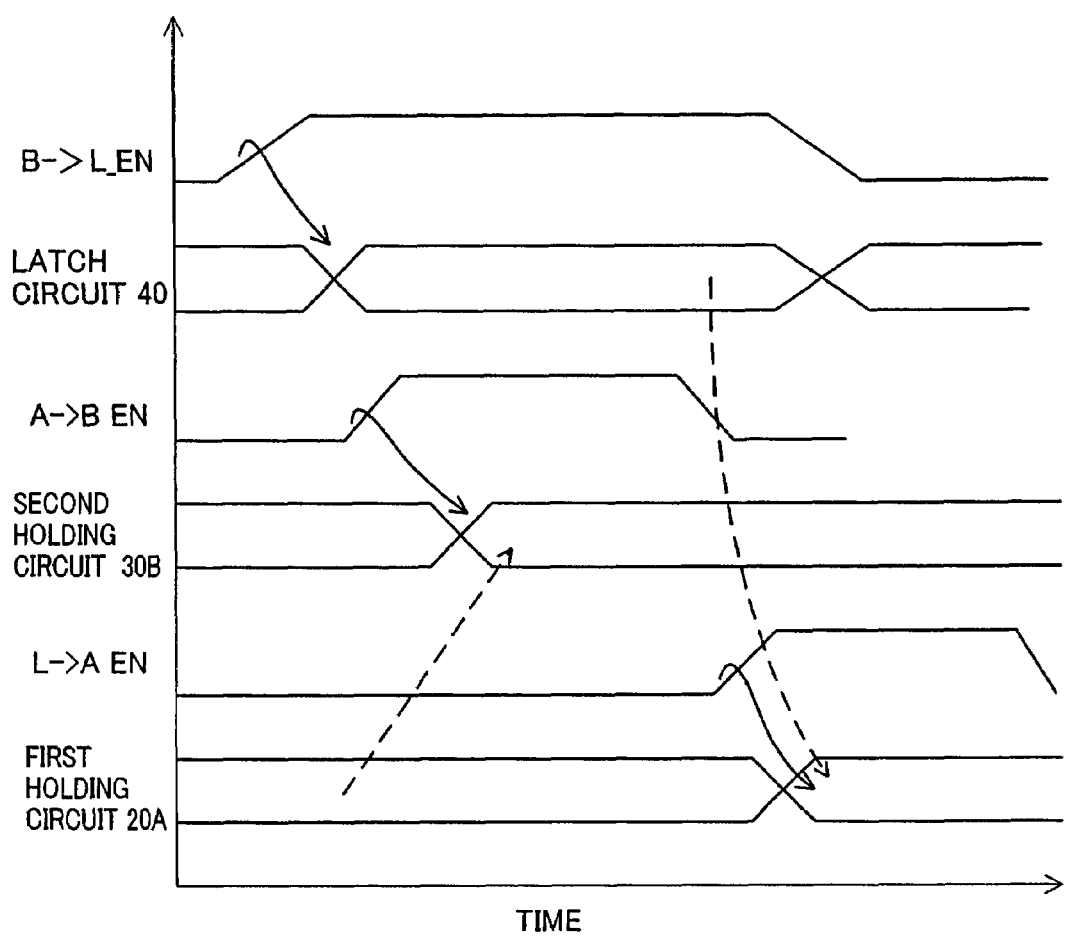
FIG. 3 shows a timing diagram of a data interchange operation in the register file.

FIG. 3 shows a timing diagram of a data interchange sequence by the interchange circuit 43. In the figure, first, the control signal B->L EN is enabled, in response to which the latch circuit 40 latches the data held in the second holding circuit 30B. Then, the control signal A->BEN is enabled, and the data held in the first holding circuit 20A is transferred to the second holding circuit 30B. Then, after the data of the first holding circuit 20A is stored in the second holding circuit 30B, the control signal A->BEN is disabled. Then, the control signal L->AEN is enabled, and the data of the second holding circuit 30B being latched in the latch circuit 40 is transferred to the first holding circuit 20A. Then, the control signal B->LEN and the control signal L->AEN become disabled, thus completing the data interchange operation between the first and second holding circuits 20A and 30B.

As can be seen from FIG. 1 and FIG. 2, since the first holding circuit 20A is basically dedicated to the 1W2R first functional block 2A, and the second holding circuit 30B is basically dedicated to the 1W1R second functional block 2B, the first holding circuit 20A is only connected to the one write port section 21AW and the two read port sections 21AR1 and 21AR2 of the 1W2R first functional block 2A, and the second holding circuit 30B is only connected to the one write port section 31BW and the one read port section 31BR of the 1W1R second functional block 2B. Conventionally, it is necessary to provide, for each of the holding circuits 20A and 30B, the same number of ports as the total number of ports (2W3R) (=5) of the two functional blocks 2A and 2B. In contrast, in the present embodiment, the number of ports of the semiconductor integrated circuit as a whole can be reduced by half, whereby it is possible to effectively reduce the area of the register file 1.

Moreover, if, for example, there is a need to interchange data between the holding circuits 20A and 30B after the first functional block 2A reads/writes data from/to the first holding circuit 20A dedicated thereto and the second functional block 2B reads/writes data from/to the second holding circuit 30B dedicated thereto, the data interchange operation is performed between the first and second holding circuits 20A and 30B via the latch circuit 40 in the memory cell array 5. Where the data interchange operation is performed by, for example, providing an external save register connected to the register file 1 via a data bus, the operation takes, as interchange time, the same number of periods as the number of entries of the register file 1. In contrast, the operation is completed in only one period in the present embodiment.

Thus, the register file 1 of the present embodiment has a small area and is yet capable of providing high-speed data write/read performance.

Moreover, in FIG. 2, since the latch circuit 40 is a differential circuit as shown in FIG. 2, the data held in the second holding circuit 30B can desirably be latched in the latch circuit 40 even if the second holding circuit 30B is a circuit that operates at a low power source voltage. Therefore, if the second write port section 31BW and the read port section 31BR dedicated to the second functional block 2B have a low activity rate (access frequency), or if the access speed of these port sections 31BW and 31BR may be lower than those of other port sections, the power source voltage for the second holding circuit 30B can be further lowered, whereby it is possible to further reduce the power consumption.

FIG. 4 shows the relationship between the activity rate (access frequency), the threshold voltage of constituent transistors and the power source voltage supplied to the constituent transistors of the write/read port sections 21AW, 21AR1, 21AR2, 31BW and 31BR, the holding circuits 20A and 30B and the latch circuit 40.

In the figure, the activity rate (access frequency), the threshold voltage of constituent transistors and the power source voltage supplied to the constituent transistors differ among a first group including the first write and read port sections 21AW, 21AR1 and 21AR2 and the first holding circuit 20A, a second group including the second write and read port sections 31AW and 31AR and the second holding circuit 30B, and a third group including the latch circuit 40. Specifically, the first group has a higher activity rate than the second and third groups, according to which the threshold voltage of constituent transistors is set to be lower and the supplied power source voltage is set to be higher. On the other hand, for the third group with the lowest activity rate, the threshold voltage of constituent transistors is set to be highest, and the supplied power source voltage is set to be lowest. For the second group with an intermediate activity rate, the threshold voltage of constituent transistors and the supplied power source voltage are set to values that are between those of the first group and those of the third group.

Thus, if a transistor has a high activity rate (access frequency), the power consumption can be reduced by lowering the threshold voltage of the transistor, and a predetermined operating speed can be ensured by setting the power source voltage for the transistor so that the operating speed of the transistor under the threshold voltage satisfies a predetermined speed. As described above, for each group, the threshold voltage of constituent transistors and the supplied power source voltage are set according to the activity rate of the group, whereby it is possible, for each group, to effectively reduce the leak current from constituent transistors, thereby reducing the power consumption, while ensuring a predetermined operating speed.

Note that constituent transistors of each of the port sections and the holding circuits of the memory cell array 5 have a substrate separate from the substrate of other port sections and holding circuits, whereby the threshold voltage thereof can be set independently. By forming the port sections and the holding circuits with transistors of different threshold voltages in the first place, it is possible to more effectively reduce the power consumption.

Moreover, if the write or read access speed of a port section differs from that of another port section depending on the required specifications, constituent transistors of different transistor widths may be produced in these port sections in the first place, thereby more effectively reducing the power consumption.

The threshold voltage of constituent transistors and the supplied power source voltage of each group shown in FIG. 4 are controlled to the predetermined value by a total of three substrate voltage control circuits 13a to 13c and a total of three power source voltage control circuits 12a to 12c, which are separately provided for the groups as shown in FIG. 1.

Figure 5:
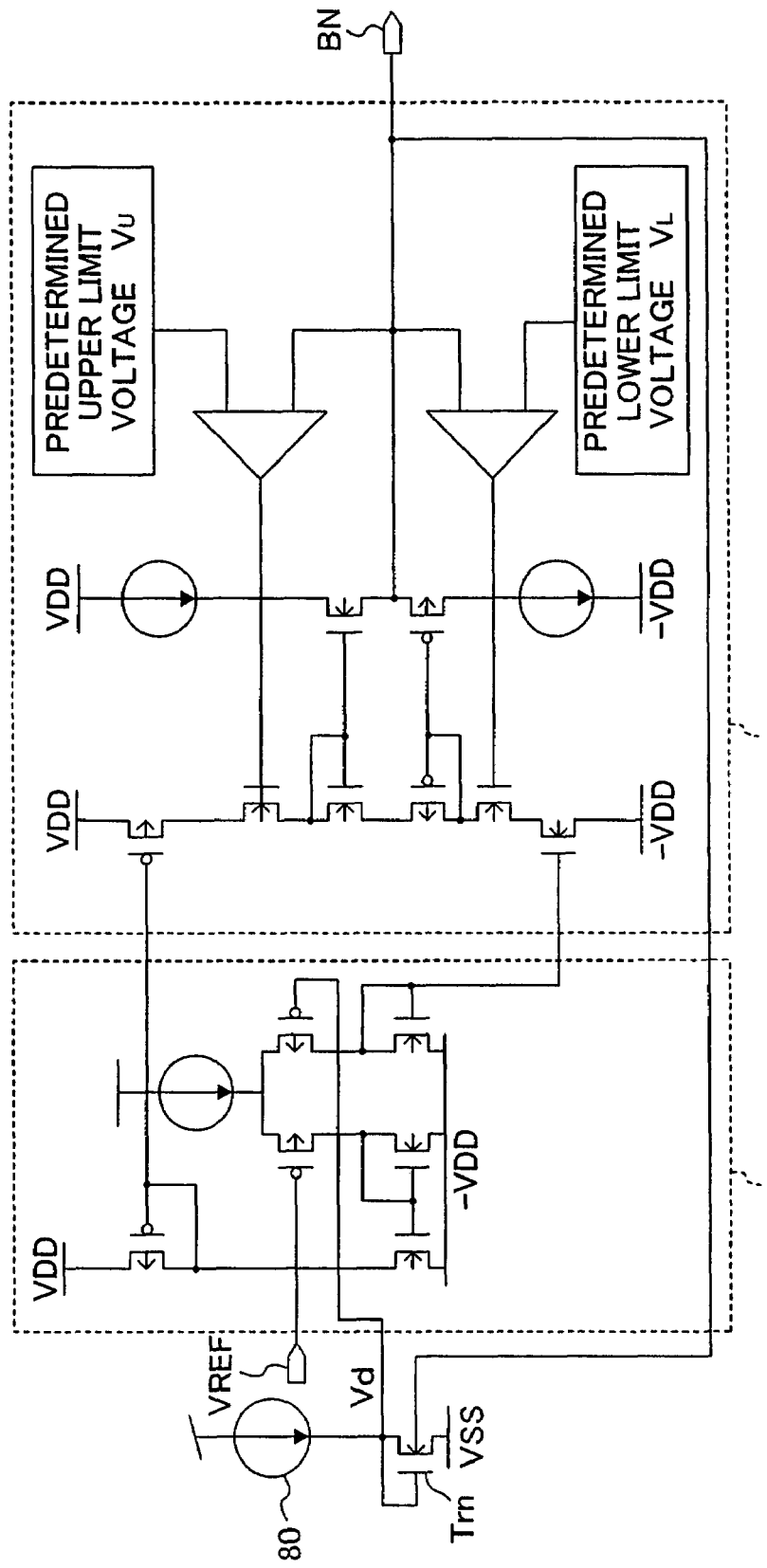
FIG. 5 shows an internal configuration of a substrate voltage control circuit provided in the semiconductor integrated circuit.

FIG. 5 shows an example of an internal configuration of the substrate voltage control circuit 13a. The other substrate voltage control circuits 13b and 13b have the same configuration. The substrate voltage control circuit 13a shown in the figure is a circuit for maintaining the threshold voltage of transistors at the predetermined value, and has an output terminal BN connected to the substrate of the N-type transistors of the port sections and the holding circuits of the first group. The internal configuration of the substrate voltage control circuit 13a shown in FIG. 5 will now be described.

In FIG. 5, the substrate voltage control circuit 13a includes N-type transistors Trn for monitoring the threshold voltage. The N-type transistors Trn are transistors produced in the same production step as the N-type transistors in the regular memory cell group 5a in the register file 1. A constant current is supplied to the N-type transistors Trn from a constant current source 80. The constant current source 80 is formed by a circuit with no temperature dependence, e.g., a bandgap reference circuit, or the like, which exhibits a constant current property, which supplies a constant current of a current value equal to the saturated current value flowing through the N-type transistors under the power source voltage supplied to the N-type transistors in the regular memory cell group 5a and under the predetermined threshold voltage of the N-type transistors. The monitoring N-type transistors Trn perform a current-voltage conversion on the constant current from the constant current source 80, and the converted voltage (drain voltage) Vd is input to a 2-input comparison section 81.

The comparison section 81 is formed by a differential amplifier, or the like, and receives the converted voltage Vd from the monitoring N-type transistors Trn at one input terminal thereof, and receives the power source voltage VREF to the N-type transistors of the object to be controlled by the substrate voltage control circuit 13a, e.g., the first write/read port sections 21AW, 21AR1 and 21AR2 and the first holding circuit 20A at the other input terminal thereof. The output side of the comparison section 81 is connected to the output terminal BN via a voltage limiting section 82 and is connected to the substrate of the monitoring N-type transistors Trn. The comparison section 81 controls the substrate voltage of the monitoring N-type transistors Trn so that the input voltages Vd and VREF are equal to each other. The controlled substrate voltage is output through the output terminal BN, and is used as the substrate voltage of the N-type transistors of the port sections and the holding circuits of the first group. Note that the voltage limiting section 82 restricts the upper limit and the lower limit of the output voltage from the output terminal BN to a predetermined upper limit voltage VU and a predetermined lower limit voltage VL.

Therefore, the substrate voltage control circuit 13a shown in FIG. 5 maintains and controls, under the supplied power source voltage VREF, the actual saturated current of the N-type transistors of the object to be controlled at a constant value, thereby maintaining the threshold voltage of the N-type transistors of the object to be controlled to a predetermined threshold voltage value. Note that while FIG. 5 shows a configuration for maintaining and controlling the substrate voltage of the N-type transistors in the regular memory cell group 5a at a predetermined value, the substrate voltage of P-type transistors can also be maintained and controlled at a predetermined value by using a similar configuration, which will not be described herein.

Each of the power source voltage control circuits 12a to 12c shown in FIG. 1 basically functions to control the power source voltage of the group to which it belongs at the predetermined power source voltage value shown in FIG. 4, and adjusts the value of the produced power source voltage by receiving a control signal from the delay-voltage conversion circuit 9 as shown in FIG. 1. For each of the first to third groups, if the operation delay varies due to a temperature variation during operation, the delay-voltage conversion circuit 9 and the DLL circuit 10 shown in FIG. 1 converts the delay variation to a voltage variation, and adjusts the power source voltage to be produced by one of the power source voltage control circuits 12a to 12c of that group with a control signal whose content is the voltage variation so as to prevent the operating speed of that group from being influenced by temperature variations.

Figure 6:
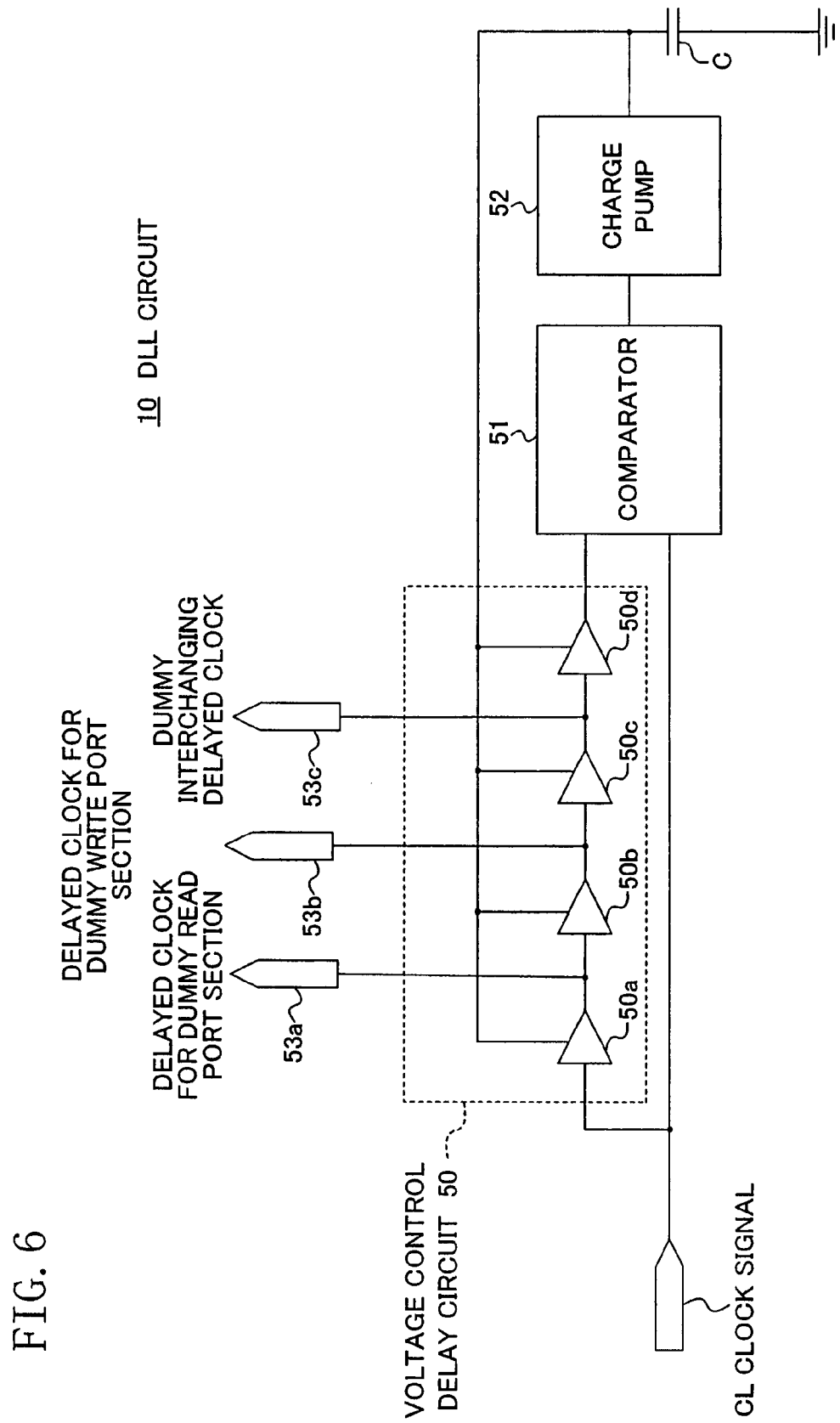
FIG. 6 shows an internal configuration of a DLL circuit provided in the semiconductor integrated circuit.
Figure 7:
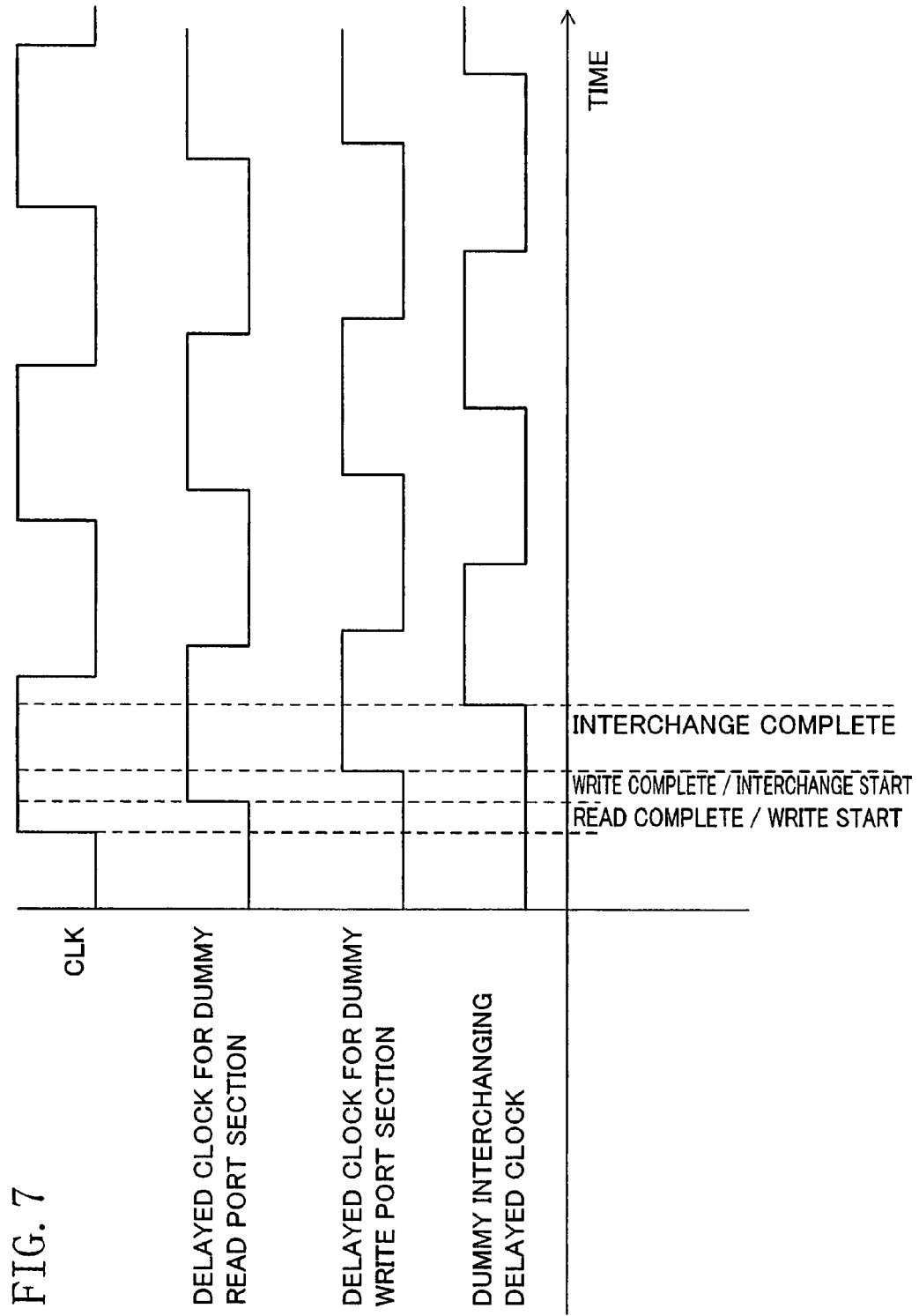
FIG. 7 shows a timing diagram of various signals output from the DLL circuit.
Figure 8:
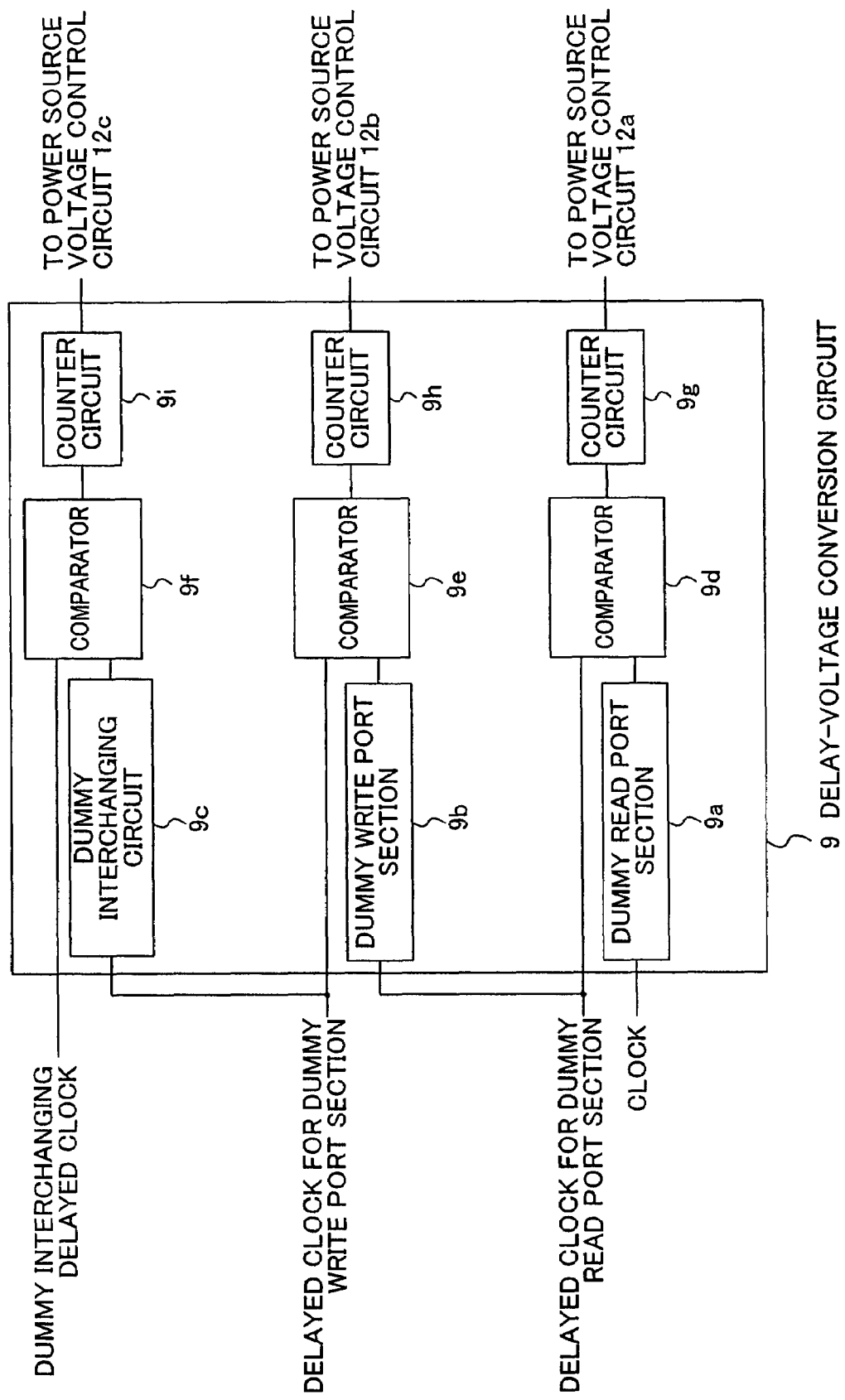
FIG. 8 shows an internal configuration of a delay-voltage conversion circuit provided in the semiconductor integrated circuit.

FIG. 6 shows an internal configuration of the DLL circuit 10 shown in FIG. 1. FIG. 8 shows an example of an internal configuration of the delay-voltage conversion circuit 9 shown in FIG. 1. The DLL circuit 10 of FIG. 6 produces a reference value for the operation delay of the read ports, the write ports and the interchange circuit 43. Specifically, the DLL circuit 10 includes a voltage control delay circuit 50 including four buffers 50a to 50d connected in series with one another, a comparator 51 for receiving and comparing the output from the voltage control delay circuit 50 and a predetermined clock signal CL, and a charge pump 52 for receiving the output from the comparator 51 to charge a capacitor C therewith, wherein the charge state of the capacitor C is fed back to the four buffers 50a to 50d. The output signal from the first buffer 50a of the voltage control delay circuit 50 is output through an output terminal 53a as the delayed clock for the dummy read port section, the output signal from the second buffer 50b is output through an output terminal 53b as the delayed clock for the dummy write port section, and the output signal from the third buffer 50c is output through an output terminal 53c as the dummy interchanging delayed clock. The relationship between these delayed clocks and the predetermined clock signal is shown in FIG. 7. The three delayed clocks are tuned in advance to the access budget of the register file 1.

The delay-voltage conversion circuit 9 shown in FIG. 8 operates by receiving the three delayed clocks from the DLL circuit 10. The delay-voltage conversion circuit 9 includes a dummy read port section 9a, a dummy write port section 9b and a dummy interchanging circuit 9c, which are formed in one of the dummy memory cell groups 5b to 5f shown in FIG. 1. These dummy port sections and the dummy interchanging circuit have the same configurations as those of the port sections 21AW, . . . , and the interchange circuit 43 formed in the regular memory cell group 5a. Moreover, the delay-voltage conversion circuit 9 is provided with a total of three comparators 9d to 9f and a total of three counters 9g to 9i corresponding to the dummy port sections and the dummy interchanging circuit.

The delay-voltage conversion circuit 9 compares, at the comparator 9d, the output signal from the dummy read port section 9a operating with a predetermined clock signal with the delayed clock for the dummy read port section (reference delayed clock) from the DLL circuit 10 and, if the delay (read time) of the dummy read port section 9a is greater, increments the counter circuit 9g with the output from the comparator 9d, thus adjusting the control signal so as to increase the power source voltage value of the power source voltage control circuit 12a for the first group. Similarly, the circuit compares, at the comparator 9e, the output signal from the dummy write port section 9b operating with the delayed clock for the dummy read port section received from the DLL circuit 10 with the delayed clock for the dummy write port section (reference delayed clock) from the DLL circuit 10 and, if the delay (write time) of the dummy write port section 9b is greater, increments the counter circuit 9h with the output from the comparator 9e, thus adjusting the control signal so as to increase the power source voltage value of the power source voltage control circuit 12b for the second group. Moreover, the circuit compares, at the comparator 9f, the output signal from the dummy interchanging circuit 9c operating with the delayed clock for the dummy write port section received from the DLL circuit 10 with the dummy interchanging delayed clock (reference delayed clock) from the DLL circuit 10 and, if the delay of the dummy interchanging circuit 9c is greater, increments the counter circuit 9i with the output from the comparator 9f, thus adjusting the control signal so as to increase the power source voltage value of the power source voltage control circuit 12c for the third group.

Therefore, using the DLL circuit 10 of FIG. 6 and the delay-voltage conversion circuit 9 of FIG. 8, even if the operation delay of the dummy read/write port sections 9a and 9b and the dummy interchanging circuit 9c varies due to a temperature variation, the power source voltage to be supplied is accordingly adjusted by the power source voltage control circuits 12a to 12c, whereby the operation delay of the regular read/write port sections 21AW, . . . , and the regular interchange circuit 43, with a similar delay to that of the dummy circuits 9a and 9c, can be maintained at a substantially constant value despite temperature variations.

Figure 9:
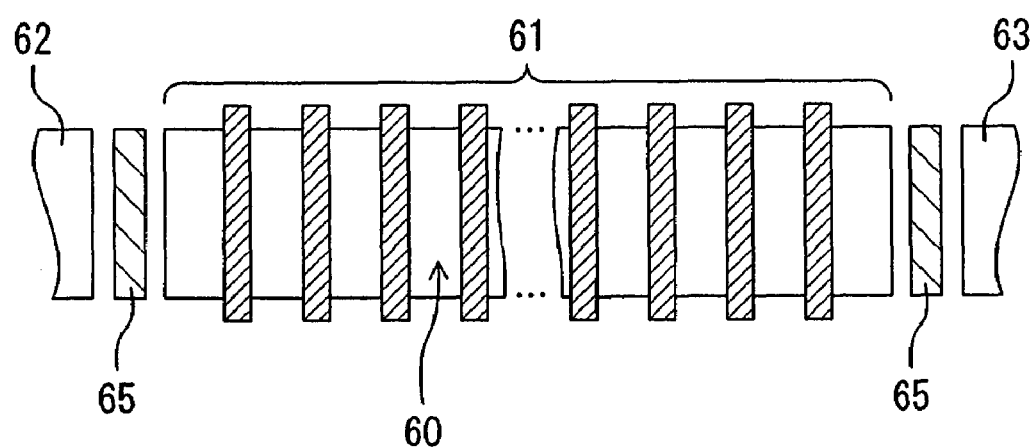
FIG. 9 schematically shows an arrangement of circuit sections operating at a higher speed and those operating at a lower operating speed in a transistor row forming the semiconductor integrated circuit.

FIG. 9 is a schematic diagram showing a layout of many transistors with which the write/read port sections 21AW, 31BR, . . . , and the holding circuits 20A and 30B are produced. In the figure, a transistor row 61 for forming the port sections and the holding circuits is formed on an N-type substrate 60. Transistors located along an edge portion of the transistor row 61 are used to form port sections and holding circuits of a relatively low operating speed, and transistors located in an inner portion of the transistor row 61 are used to form port sections and holding circuits of a relatively high operating speed. With this configuration, a device separation region (STI) 65 is placed on the N-type substrate 60 between the transistor row 61 and each of other transistor rows 62 and 63 on the left and right of the transistor row 61, and transistors along an edge portion of the transistor row 61 have a greater degree of deterioration due to the influence of the STI. However, the deterioration has little influence because port sections and holding circuits of a low operating speed are arranged in this portion. On the other hand, port sections and holding circuits of a high operating speed are formed by transistors that are located in an inner portion of the transistor row 61 and are thus less influenced by the STI, whereby it is possible to desirably ensure the high operating speed.

Figure 10:
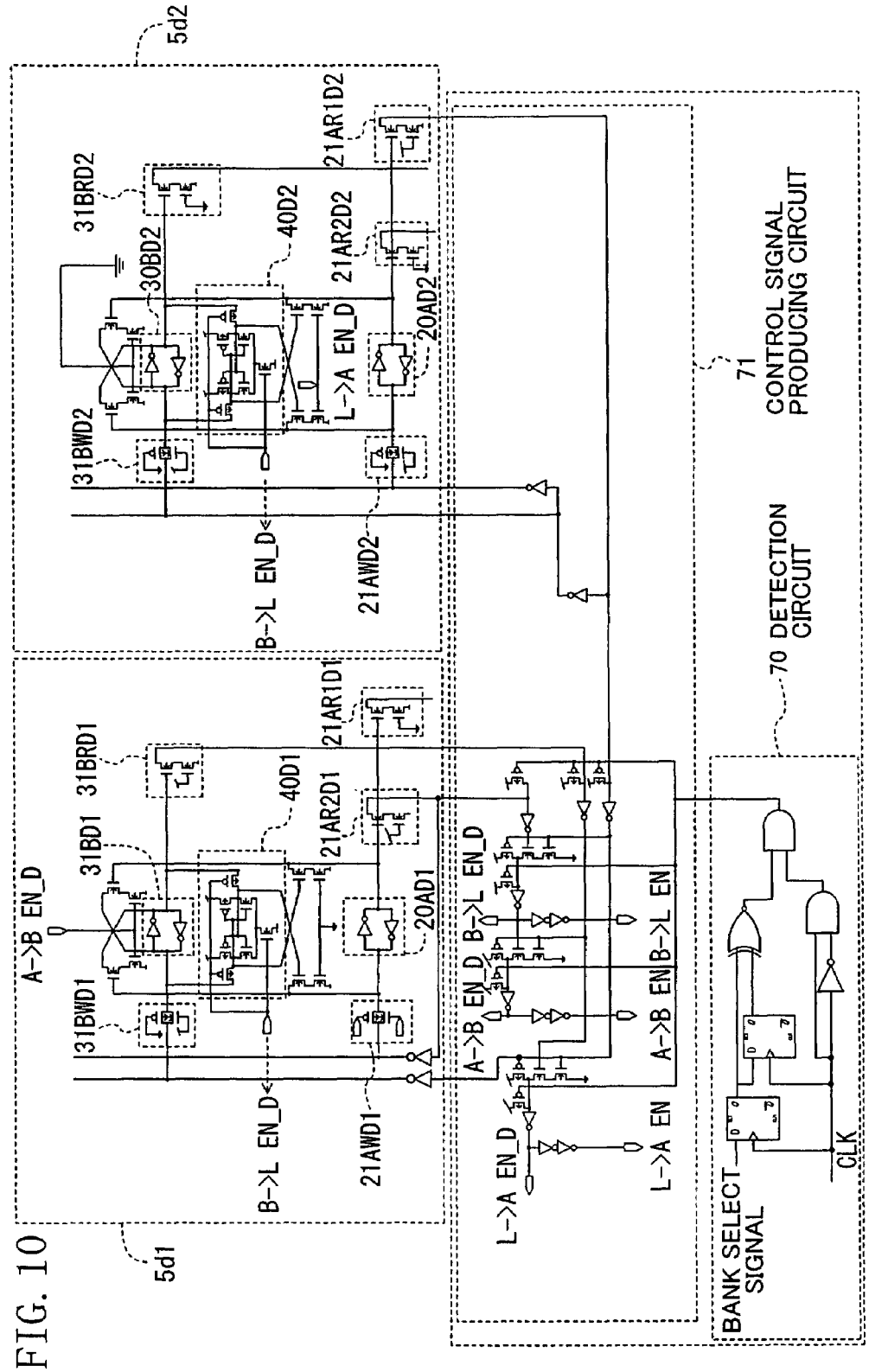
FIG. 10 is a circuit diagram showing an internal configuration of a control circuit provided in the semiconductor integrated circuit, and the details of the production of various control signals taking into account an actual data interchange operation using two dummy circuits.

FIG. 10 is a configuration for reliably performing a data interchange operation between the two holding circuits 20A and 30B in the regular memory cell group 5a by using the results of an actual data interchange operation using a plurality of dummy holding circuits in the dummy memory cell group 5d.

In the figure, two circuits 5d1 and 5d2 equivalent to the circuit shown in FIG. 2 in the dummy memory cell group 5d are used, and the control circuit 8 includes a detection circuit 70 for detecting when a data interchange operation is needed, and a control signal producing circuit 71 receiving the output signal from the detection circuit 70 to produce six data interchange control signals (interchange control signals) B->LEN_D, B->LEN, A->BEN_D, A->BEN, L->AEN_D and L->AEN.

The two dummy circuits 5d1 and 5d2 have similar basic configurations to that of the circuit of FIG. 2, and therefore like elements thereof to those of FIG. 2 are denoted by like reference numerals followed by D1 and D2, respectively, and will not be further described below. The dummy circuit 5d1 is for detecting the amount of time required for a data interchange operation from a first dummy holding circuit (first dummy information holding circuit) 20AD1 to a second dummy holding circuit (second dummy information holding circuit) 30BD1, and the other dummy circuit 5d2 is for detecting the amount of time required for a data interchange operation from a dummy latch circuit 40D2 to a first dummy holding circuit 20AD2. In the first dummy circuit 5d1, a first read port section 21AR2D1 and a second read port section 31BRD1 are connected to the control signal producing circuit 71. On the other hand, in the second dummy circuit 5d2, a first read port section 21AR1D2 is connected to the control signal producing circuit 71.

When the detection circuit 70 receives a bank select signal and the accessed bank is switched from one bank to another, i.e., after data that should be held in the first and second holding circuits 20A and 30B are held therein, the detection circuit 70 detects a potential variation in the bank select signal and determines that a data interchange operation is needed, thereby outputting a detection signal.

Moreover, the control signal producing circuit 71 operates as follows. For example, in an initial state, in the dummy circuit 5d1, "1" data is stored in the first dummy holding circuit 20AD1, and "0" data is stored both in the second dummy holding circuit 30BD1 and in a dummy latch circuit 40D1, whereas in the other dummy circuit 5d2, "0" data is stored in the first dummy holding circuit 20AD2 and "1" data is stored both in a second dummy holding circuit 30BD2 and in the dummy latch circuit 40D2.

Then, after the initial state, when a data interchange operation is needed, i.e., when a detection signal is received from the detection circuit 70, the control signal producing circuit 71 outputs to the dummy circuit 5d1 a control signal A->BEN_D for enabling a data interchange operation from the first dummy holding circuit 20AD1 to the second dummy holding circuit 30BD1 and, with a predetermined time delay, outputs to the regular circuit of FIG. 2 a control signal A->BEN for enabling a data interchange operation from the first holding circuit 20A to the second holding circuit 30B. Then, when the data of the first dummy holding circuit 20AD1 is relocated to the second dummy holding circuit 30BD1 of the dummy circuit 5d1 and the data "1" is actually read out from the read port section 31BRD1, the circuit stops outputting the control signals A->BEN_D and A->BEN with a predetermined time delay therebetween. Then, the circuit outputs to the other dummy circuit 5d2 a control signal L->AEN_D for enabling a data interchange operation from the dummy latch circuit 40D2 to the first dummy holding circuit 20AD2 and, with a predetermined time delay, outputs to the regular circuit of FIG. 2 a control signal L->AEN for enabling a data interchange operation from the latch circuit 40 to the first holding circuit 20A.

Then, when the data "1" of the dummy latch circuit 40D2 is transferred to the first dummy holding circuit 20AD2 in the other dummy circuit 5d2 and is read out from the read port section 21ARD2, the control signal producing circuit 71 stops outputting the control signals L->AEN_D and L->AEN with a predetermined time delay therebetween.

A data interchange operation between the two holding circuits 20A and 30B in the regular circuit of FIG. 2 is performed while taking into account the actual interchange time obtained by actually performing a data interchange operation with the dummy circuits 5d1 and 5d2 by the detection circuit 70 and the control signal producing circuit 71 provided in the control circuit 8. Therefore, it is possible to reliably perform a data interchange operation in the regular circuit and to stop outputting the control signals B->LEN, A->BEN and L->AEN after the completion of the data interchange operation.

(Variation of Configuration for Controlling Data Interchange Operation Using Dummy Holding Circuit)

Figure 11:
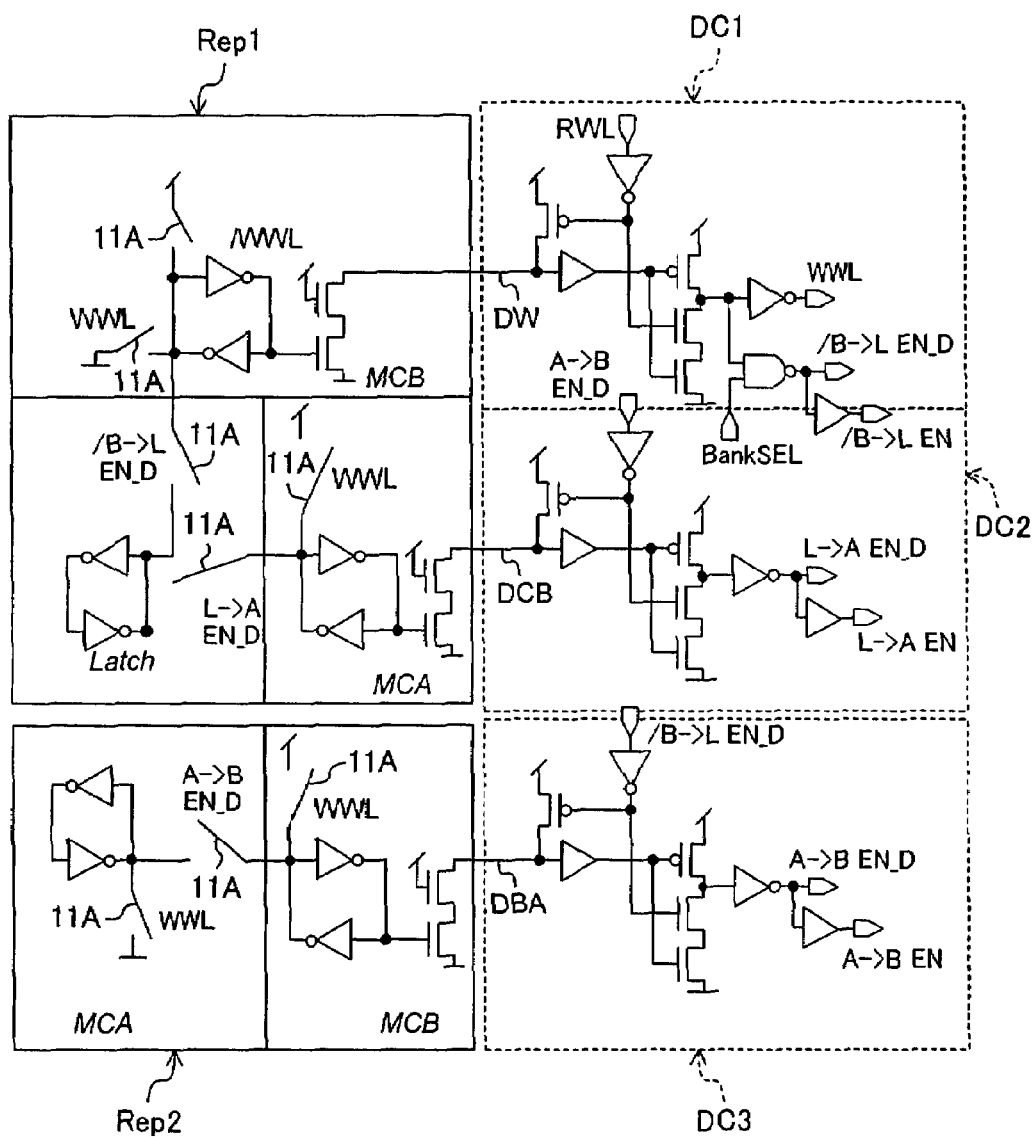
FIG. 11 is a circuit diagram showing the details of a data interchange signal producing circuit using a control circuit and two dummy circuits provided in the semiconductor integrated circuit.

FIG. 11 shows a variation of a circuit for producing the six data interchange control signals (interchange control signals) B->LEN_D, B->LEN, A->BEN_D, A->BEN, L->AEN_D and L->AEN when forming a circuit for detecting the completion of a write operation at a dummy circuit after reading out data of the register file and completing a data interchange operation between two memory cells. The circuit corresponds to the circuits 5d1 and 5d2 equivalent to the circuit shown in FIG. 2 in the dummy memory cell group 5d and the control signal producing circuit 71 shown in FIG. 10.

The circuit shown in FIG. 11 also uses two dummy circuits Rep1 and Rep2 as described above with reference to FIG. 10.

The configuration of FIG. 10 interchanges data on write bit lines and completes the write operation with one write port, after which the state is brought back to the initial state. In contrast, in the two dummy circuits Rep1 and Rep2 shown in FIG. 11, bit lines connected to two write ports are set to a fixed potential in advance, and the completion of a write operation is detected with a write control signal WWL and an inverted signal /WWL thereof, after which the information of the holding circuits are brought back to the initial state. Note that although each element denoted by reference numeral 11A in FIG. 11 is schematically represented by a switch symbol, it is actually a MOS transistor, and is turned ON/OFF by a control signal whose name is shown near the reference numeral.

Figure 12:
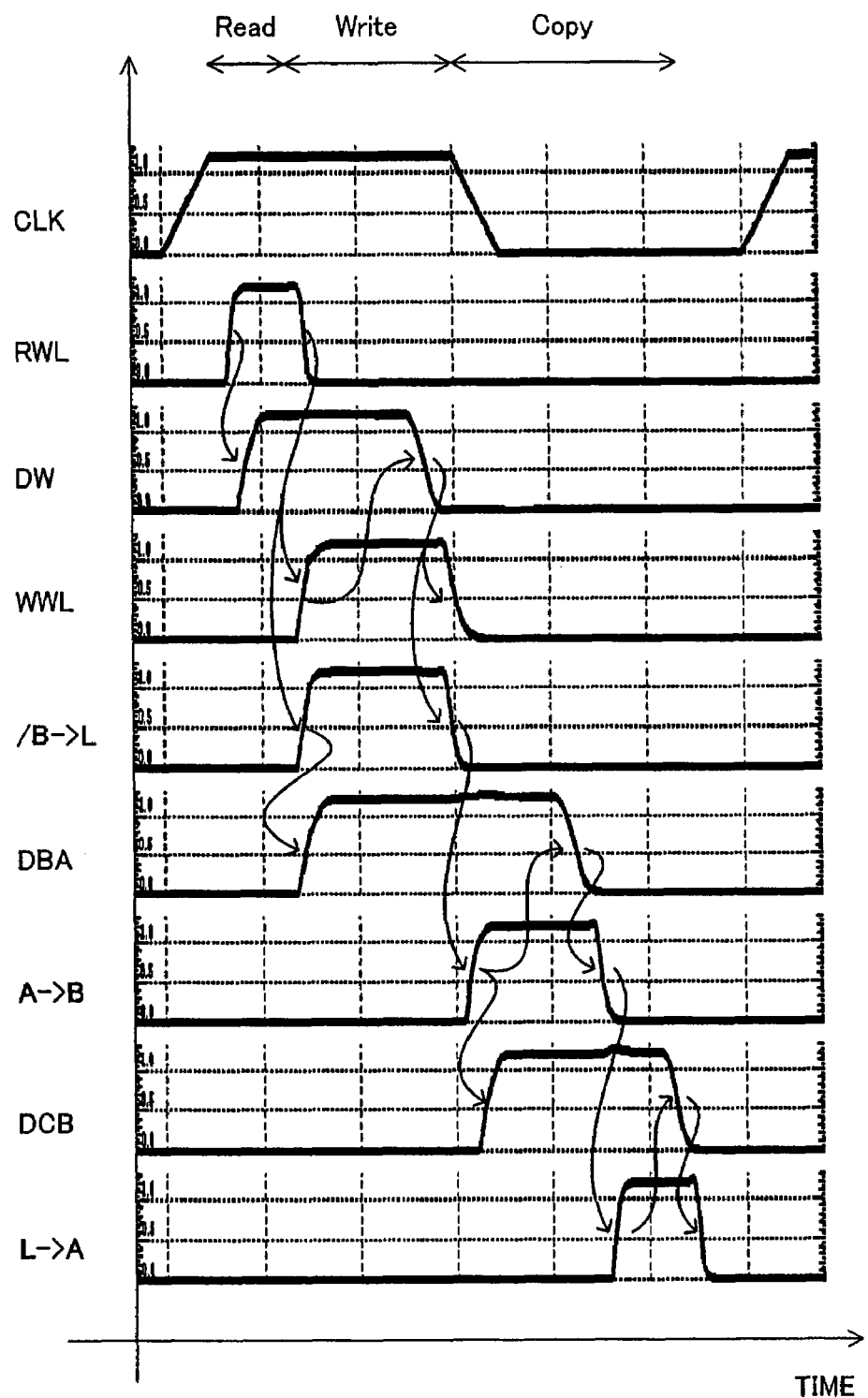
FIG. 12 shows a timing diagram of a data interchange operation by the data interchange signal producing circuit.

FIG. 12 shows a timing diagram at each node in FIG. 11. With reference to FIG. 12, the configuration and the operation of the circuit of FIG. 11 will be described.

After a clock signal CLK of the register file rises, a control signal RWL of a read port of the register file is enabled, and a node DW of a dynamic circuit DC1 (a circuit equivalent to the control signal producing circuit 71 in FIG. 10) is precharged. Then, when the read control signal RWL is disabled, the write control signal WWL and the inverted signal of the interchange control signal B->L are enabled, and a node DBA of a dynamic circuit DC3 is precharged. As the write control signal WWL is enabled, the node DW of the dynamic circuit DC1 is discharged, the write control signal WWL and the inverted signal of the interchange control signal B->L are disabled, the interchange control signal A->B is enabled, and a node DCB of a dynamic circuit DC2 is precharged. Moreover, as the interchange control signal A->B is enabled, the node DBA of the dynamic circuit DC3 is discharged. Then, when the interchange control signal A->B is disabled and the interchange control signal L->A is enabled, the node DCB of the dynamic circuit DC2 is discharged, and the interchange control signal L->A is disabled, thus completing a write detection operation and an information interchange operation between two holding circuits.

The circuit shown in FIG. 11 is advantageous where there are multiple write ports, and the area can be reduced because write bit lines do not need to be transitioned. Note that while a read operation (Read), a write operation (Write) and an interchange operation (Copy) are completed within one cycle of the clock signal CLK in the timing diagram of FIG. 12, it is understood that the read operation (Read) and the write operation (Write) may be completed within one cycle of the clock signal while completing the interchange operation (Copy) in the second cycle. Although a 1-cycle latency occurs for the interchange operation, this causes little deterioration in performance in applications such as a multi-thread processor to be described later.

(Alternative Example of Power Source Voltage Control)

FIG. 13 shows another example of how to control the activity rate (access frequency), the threshold voltage and the power source voltage of port sections, holding circuits and a latch circuit as shown in FIG. 4. FIG. 13 shows an example where the register file includes a 7R5W memory cell MCA, a 1R1W memory cell MCB and an interchange circuit (latch circuit) for interchanging data between these two memory cells MCA and MCB, and where the parameters are controlled so that the memory cells MCA and MCB operate at a substantially constant speed. The threshold voltages and the power source voltages in the figure are target values where there is no production process variations and the temperature conditions are optimal.

Normally, in a register file, even if the activity rate (access frequency) varies from one port to another, the ports are controlled to be at a constant access speed so as to satisfy the operation specifications thereof. Where an interchange circuit, which is a characteristic element of the present invention, is added, the interchange circuit is also controlled to be at the substantially constant access speed. Generally, if the threshold voltage of a MOS transistor is increased according to the activity rate in order to reduce the power consumption, the access speed thereof will be lowered. Therefore, the power source voltage is set at a higher level in order to compensate for the access speed. While the power source voltage is set at a lower level as the activity rate is lower in FIG. 4 because the primary object is to reduce the power consumption, it is necessary to increase the power source voltage as the access frequency is lower in order to achieve a substantially constant access speed. Nevertheless, a further reduction in power consumption can be made. For example, with a 90 nm CMOS transistor, the leak current can be reduced to 1/1000 or less if the threshold voltage is higher than 200 mV by about 200 mV, and the leak current ratio between where the power source voltage is 0.8 V and where it is 1 V is only ¼. Thus, as a whole, the leak current can be reduced to 1/250 from that when the threshold voltage is set at a low level. The reason why the threshold voltage and the power source voltage value of the interchange circuit are set to the same values as those of one memory cell MCB in FIG. 13 will be stated later.

Figure 14A:
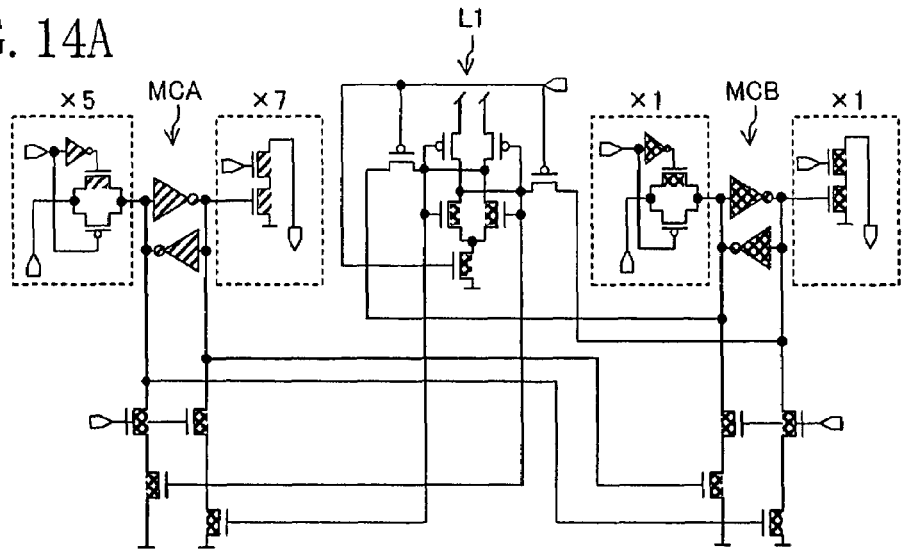
FIG. 14 shows an important part of an internal configuration of a register file satisfying the relationship shown in FIG. 13.

FIG. 14(a) shows a circuit diagram where the threshold voltage is optimized based on the settings of the various parameters such as the activity rate and the threshold voltage shown in FIG. 13 and in order to reduce the area, production variations and temperature variations of the memory cells MCA and MCB.

In FIG. 14(a), the constituent PMOS transistors of the 7R/5W memory cell MCA, the 1R/1W memory cell MCB and an interchange circuit (latch circuit) L1 are commonly set at a threshold voltage, and the constituent NMOS transistors are produced with a low threshold voltage and a high threshold voltage in their production process steps so that only the threshold voltage of the constituent NMOS transistors are different between the memory cells MCA and MCB. The threshold voltages can be set by varying the concentration at each junction or the material or thickness of the gate oxide film.

Figure 14B:
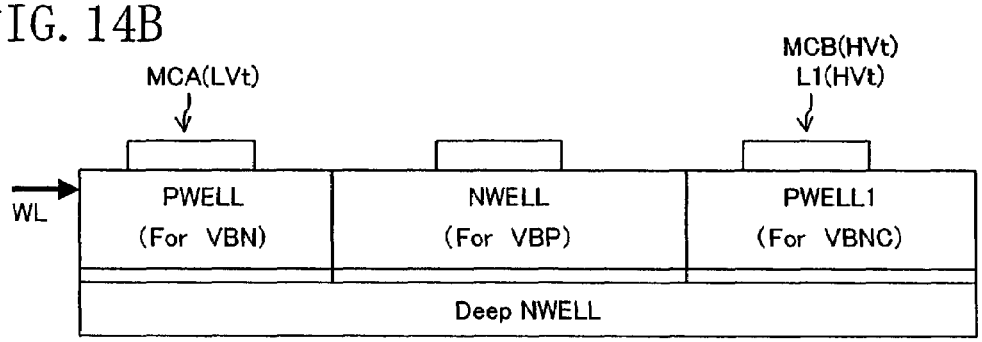

Moreover, a substrate voltage for adjusting the threshold voltage Vt of the NMOS transistors at a constant value despite temperature variations and production process variations is supplied from a substrate voltage producing circuit (not shown) to the substrate of the memory cells MCA and MCB and the constituent NMOS transistors of the interchange circuit L1. FIG. 14(b) shows a cross section of the physical structure.

In FIG. 14(b), for the left-side NMOS transistor of the memory cell MCA having a low threshold voltage LVt, a substrate voltage VBN is supplied to PWELL from the substrate voltage producing circuit, as shown also in FIG. 14(d) and FIG. 14(f). For the right-side NMOS transistor of the memory cell MCB and the interchange circuit L1 having a high threshold value HVt, a substrate voltage of VBNC is supplied to PWELL1 from the substrate voltage producing circuit, as shown also in FIG. 14(c) and FIG. 14(e). For the center PMOS transistor in FIG. 14(b), a substrate voltage VBP is supplied to NWELL. Thus, even if the activity rate somewhat varies from one circuit to another, it is possible to reduce the area by sharing the threshold voltage and the power source voltage while taking into consideration the physical arrangement. Specifically, although the memory cell MCB and the interchange circuit L1 have different activity rates, they share a common feature of having a sufficiently low activity rate and therefore share the same threshold voltage and the same power source voltage, thus minimizing the increase in area due to substrate separation.

Also with the PMOS transistors, it is possible to reduce the area by sharing the same threshold voltage and the same power source voltage. This is for the following reason. Also with PMOS transistors, it will be necessary to separately provide NWELLs of the PMOS transistors when differently setting the threshold voltages between two memory cells MCA and MCB of different access frequencies, and supplying different power source voltages to the substrates of the PMOS transistors from the substrate voltage producing circuit so that a constant threshold voltage Vt can be set despite temperature variations and process variations. Between the NWELL separation width and the PWELL separation width, the separation width is typically greater for the well with a deeper common well. Therefore, in this case, the overhead with NWELL separation is greater than that with PWELL separation. For example, they are 2 μm and 1 μm, respectively, for the 90-nm CMOS generation.

Moreover, in FIG. 14(a), the power source voltage of the memory cell MCB is set to a higher level than the memory cell MCA, and the power source voltage of the interchange circuit L1 is set to the same voltage value as the power source voltage of the memory cell MCB. With such a configuration, a data interchange operation is performed by first passing data from one memory cell MCB to the interchange circuit L1, then passing data from the other memory cell MCA to the memory cell MCB, and finally passing data from the interchange circuit L1 to the other memory cell MCA. This has an effect of suppressing the through current. The reason will be stated in detail below.

If the power source voltage of a write port of the memory cell MCB is lower than the power source voltage of the interchange circuit L1 and the node at the connection point between the write port of the memory cell MCB and the holding circuit is at Hi, the voltage value at the node is equal to the power source voltage of the interchange circuit L1. However, since the power source voltage of the write port of the memory cell MCB is a low voltage, the voltage at the node may possibly be higher than the power source voltage of the write port of the memory cell MCB. Then, even if the potential of the bit line connected to that write port is L, the gate voltage of the constituent PMOS transistors of the transfer gates forming the write port may possibly be lower than the power source voltage of the connection node between the write port and the holding circuit of the memory cell MCB by the threshold voltage of the PMOS transistors. Then, the constituent PMOS transistors of the transfer gates forming the write port will be ON. Thus, a through current may possibly flow from the connection node between the write port and the holding circuit of the memory cell MCB to the write bit line. However, if the power source voltage of the memory cell MCB is set to be greater than or equal to the power source voltage of the interchange circuit L1 as with the configuration shown in FIG. 14(a), the gate voltage of the constituent PMOS transistors of the transfer gates forming the write port will not be lower than the power source voltage of the connection node between the write port and the holding circuit of the memory cell MCB by the threshold voltage of the PMOS transistors, and thus no through current flows.

Figure 15:
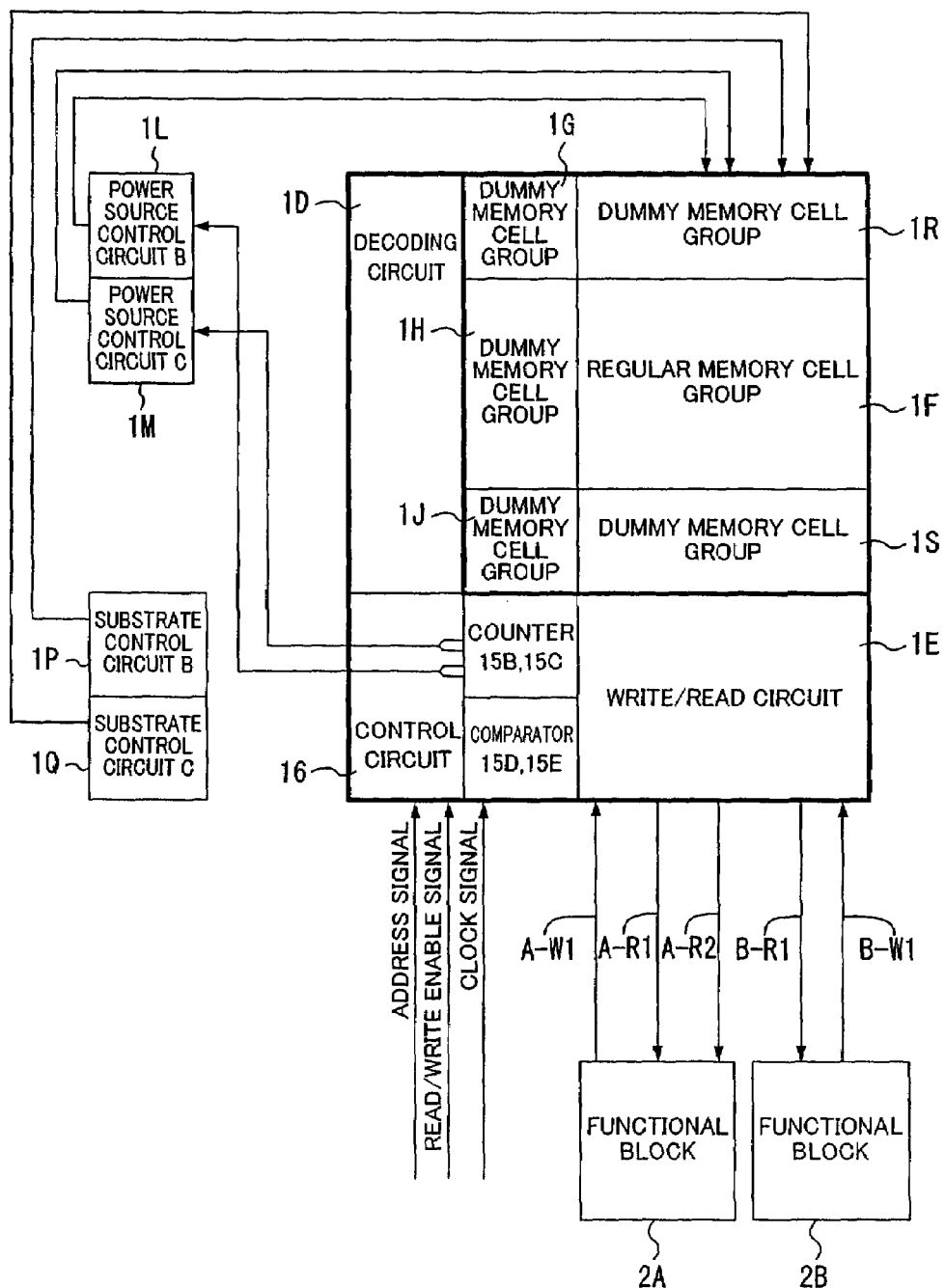
FIG. 15 shows a general schematic configuration of the register file satisfying the relationship shown in FIG. 13.
Figure 16:
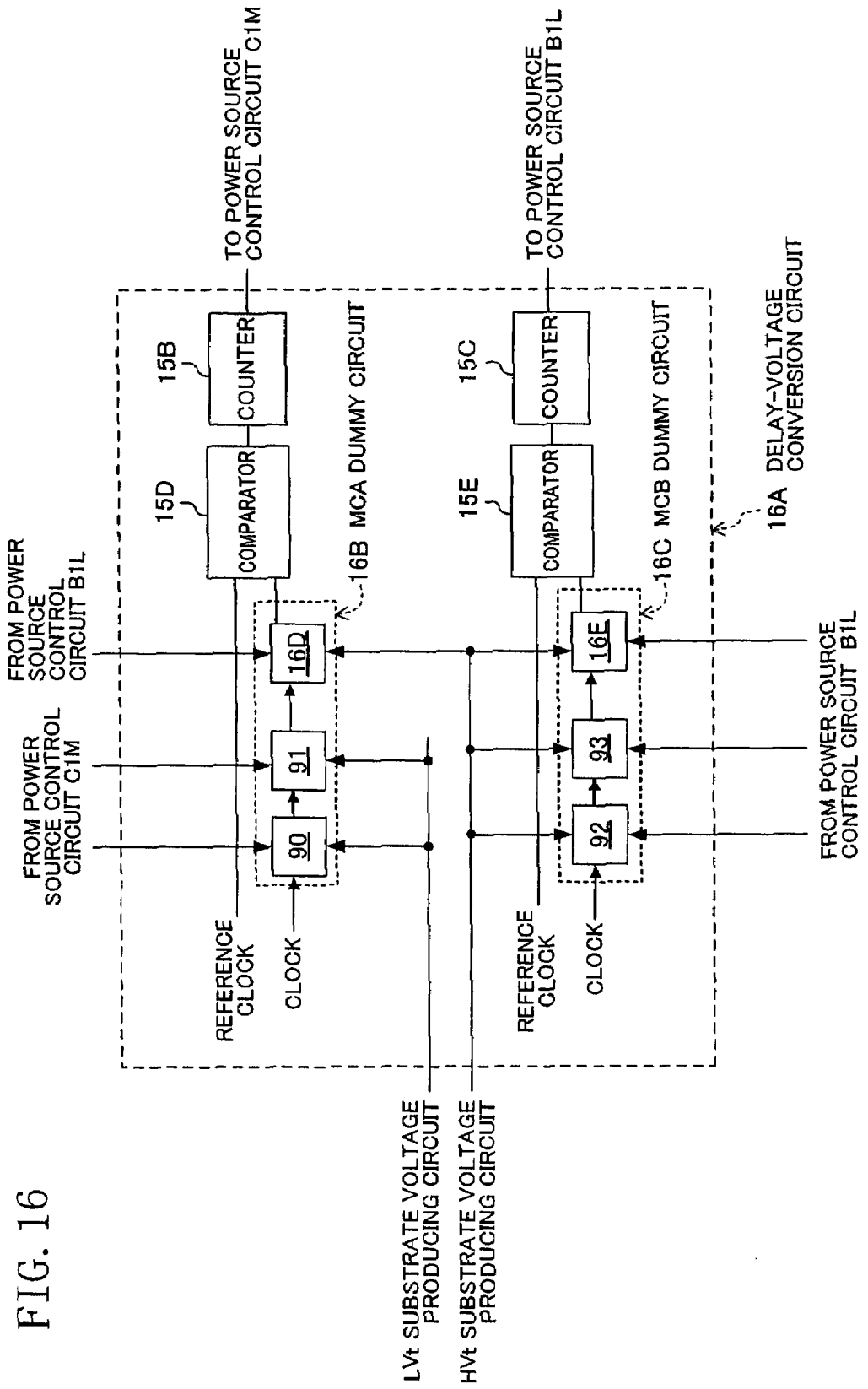
FIG. 16 is a circuit diagram showing an internal configuration of a delay-voltage conversion circuit.

Next, FIG. 15 shows the physical layout of a register file using a substrate voltage supply circuit and a power source voltage supply circuit in which memory cells of FIG. 14 are used. The register file performs a read operation and a write operation after the completion of the read operation within one cycle, and then performs an interchange operation between one memory cell MCA and the other memory cell MCB. Comparators 15D and 15E and counters 15B and 15C shown in FIG. 15 correspond to the delay-voltage conversion circuit 9 shown in FIG. 1, and a configuration using these elements in combination with dummy memory cells 1J is shown in FIG. 16. Note that the loss with respect to the supply of the power source voltage does not substantially differ whether power source control circuits B1L and C1M and substrate voltage producing circuits B1P and C1P are provided inside or outside the register file in FIG. 15. Therefore, when a similar power source voltage is given to other semiconductor integrated circuit blocks, these power source control circuits are shared outside the register file, and when it is not given to the outside, placing them inside the register is efficient area-wise as there is less area overhead such as wire routing.

With reference to FIG. 16, the details of the present voltage control configuration will be further described. In a delay-voltage conversion circuit 16A shown in FIG. 16, an MCB dummy circuit (first dummy circuit) 16C and an MCA dummy circuit (second dummy circuit) 16B are located in the dummy memory cell group 1J of FIG. 15. In the MCA dummy circuit 16B, there are a read detection circuit 90 for detecting a data read operation from the memory cell MCA, a write detection circuit 91 for detecting a write operation, and an interchange detection circuit 16D. The read detection circuit 90 operates by receiving a clock signal, the write detection circuit 91 operates by receiving a read detection signal output from the read detection circuit 90, and the interchange detection circuit 16D operates by receiving a write detection signal output from the write detection circuit 91. The basic configuration of the read detection circuit 90, the write detection circuit 91 and the interchange detection circuit 16D is similar to the circuit configuration of FIG. 10 and FIG. 11, and includes dummy memory cells and dynamic circuits. Those skilled in the art can design the circuits based on FIG. 10 and FIG. 11.

Since the write port section, the read port section and the holding circuit of the memory cell MCA are all formed by NMOS transistors of a low threshold voltage LVt, the MCA dummy circuit 16B is designed with similar NMOS transistors of a low threshold voltage LVt. The interchange detection circuit 16D is formed by NMOS transistors of a high threshold voltage HVt, as is the interchange circuit (latch circuit) shown in FIG. 13.

Therefore, the MCA dummy circuit 16B outputs an output signal after a series of operations, i.e., a data read operation from memory when the clock signal is input to the read detection circuit 90, a data write operation to memory, and a data interchange operation. The comparator 15D compares the delayed phase of the output signal from the MCA dummy circuit 16B with the reference clock being the operation clock of the register file, and outputs the result to the counter circuit 15B. The counter circuit 15B is incremented if the output signal from the interchange detection circuit 16D is behind the reference clock, and is decremented if the output signal from the interchange detection circuit 16D is ahead of the reference clock. The count of the counter circuit 15B is output to the power source control circuit (the power source voltage adjustment circuit and the power source voltage supply circuit) C1M. The power source control circuit C1M operates to increase the power source voltage if the counter is incremented, and to decrease the power source voltage if the counter is decremented. While the basic configuration and operation of the other MCB dummy circuit 16C are similar to those of the MCA dummy circuit 16B, a read detection circuit 92 and a write detection circuit 93 are configured to use a high threshold voltage HVt.

Figure 17:
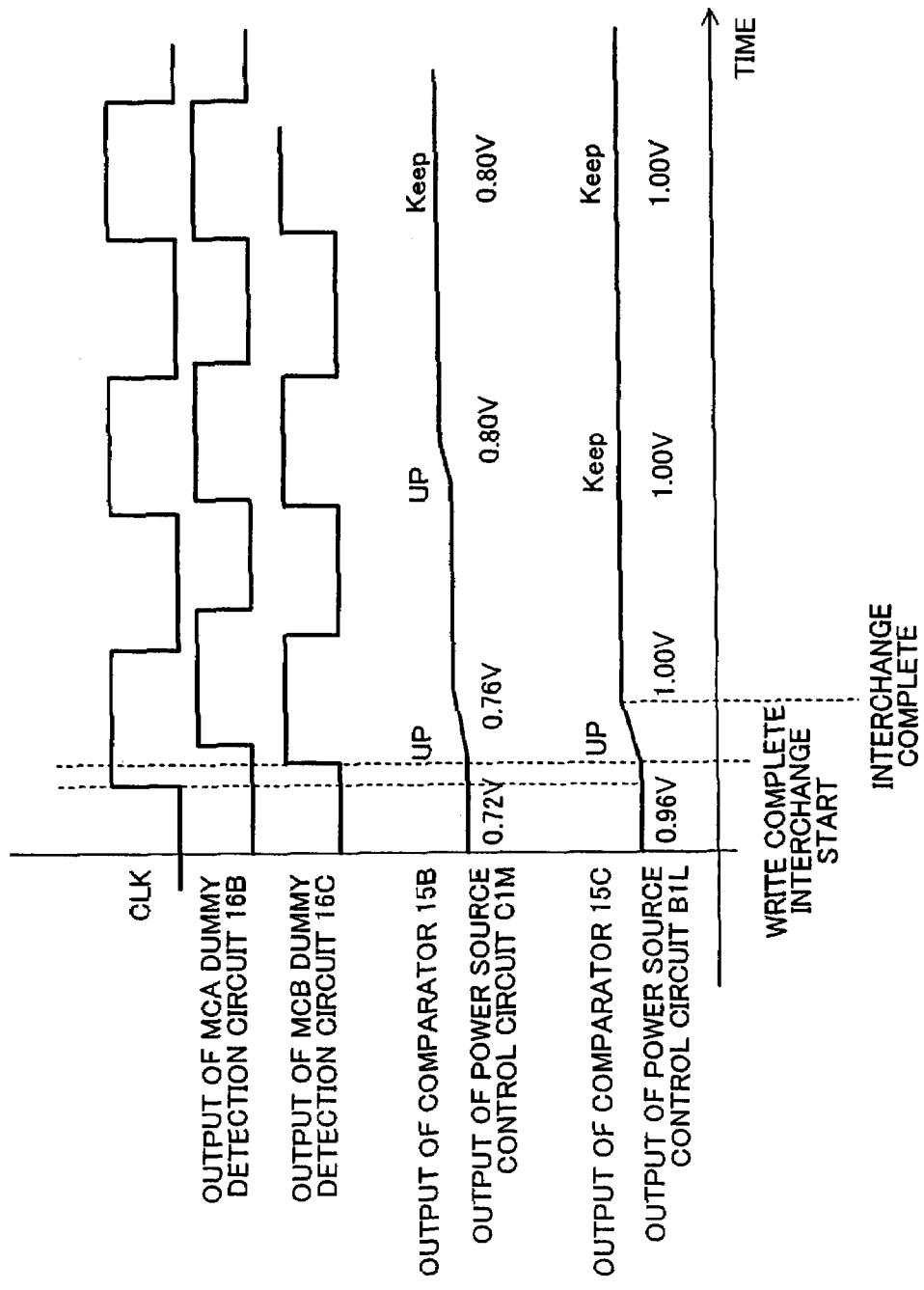
FIG. 17 shows an operation timing diagram of the delay-voltage conversion circuit.

FIG. 17 shows a timing diagram of the circuit of FIG. 16 as described above. The operation will now be described with reference to FIGS. 15 to 17.

Referring to FIG. 17, initially, the supplied power source voltage is not appropriate and is low for both the MCA dummy circuit 16B and the MCB dummy circuit 16C. First, the delay of the output signal from the MCB dummy circuit 16C and the period of the reference clock is compared by the comparator 15E and, as a result, the power source voltage for the MCB dummy circuit 16C is set to 1.0 V, which is optimal for one cycle. From the second cycle on, the comparator 15E gives an in-phase output signal, and the power source voltage is kept at 1.0 V. As the power source voltage is set to the voltage corresponding to the high MOS transistor threshold voltage HVt (=1.0 V), the power source voltage of the interchange detection circuit 16D in the MCA dummy circuit 16B is settled to 1.0 V, and with settings such that the delay of the MCA dummy circuit 16B and the reference clock signal are in phase with each other in this state, the power source voltage of the MCA dummy circuit 16B is also set to 0.8 V, which is an optimal power source voltage. From the third cycle on, since an in-phase state is achieved, the power source voltage value is kept at 0.8 V.

It has been shown that in a path carrying both a circuit using MOS transistors of a high threshold voltage HVt and a circuit using MOS transistors of a low threshold voltage LVt as described above, the circuit of FIG. 16 is an effective configuration for a scheme in which optimal power source voltages are given to circuits where the power source voltage of the circuit on the high threshold voltage HVt side is different from the power source voltage of the circuit on the low threshold voltage LVt side. Specifically, in FIG. 16, the power source voltage of a circuit including only MOS transistors of a single predetermined threshold voltage is first determined by comparing the delay of the circuit with a predefined delay value, and then based on the determined power source voltage, the power source voltage value of the other circuit, i.e., the circuit including MOS transistors of a different predetermined threshold voltage, is determined.

If all paths carry a plurality of circuits including MOS transistors of different threshold voltages, there will be two variables, whereby the power source voltage cannot be settled for any of the circuits, and the feedback loop will not converge. In contrast, the feedback loop can converge by, as in the present example, first determining the power source voltage of a circuit including MOS transistors of a predetermined threshold voltage by using a path including a plurality of MOS transistors of a single threshold voltage, and then determining the power source voltage of a circuit including MOS transistors of another threshold voltage by using the first determined power source voltage. Moreover, this scheme, as compared with the circuit scheme of FIG. 8 as described above, can be realized with an even smaller area because the DLL circuit, etc., are not needed.

Note that while the present example is an example where circuits of MOS transistors in which only the NMOS transistors have different threshold voltages are provided together, it can similarly be applied to an example where circuits of MOS transistors in which the PMOS transistors also have different threshold voltages are provided together. Moreover, it is understood that even if there are MOS transistors of three different threshold voltages, the power source voltage values can be determined based on the present scheme by producing a circuit including MOS transistors of a single threshold voltage, a circuit including MOS transistors of two different threshold voltages, and a circuit including MOS transistors of three different threshold voltages.

(Another Variation of Memory Cell)

Figure 18:
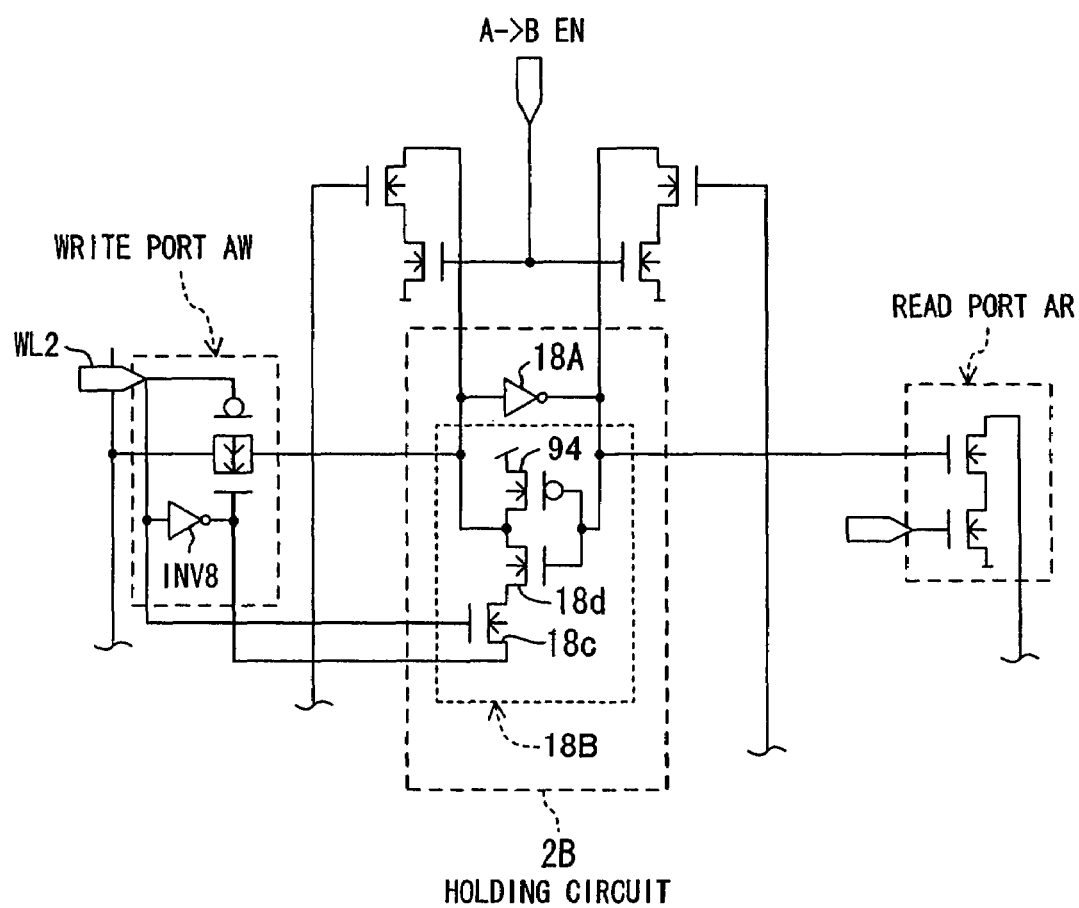
FIG. 18 shows a circuit configuration of a 1R/1W memory cell in the register file.

FIG. 18 shows another variation of a memory cell of a register file.

The figure shows a 1R/1W memory cell having a configuration obtained by combining together the second write port section 31BW, the transfer circuit 42, the second holding circuit 30B and the second read port section 31BR of FIG. 2, or a configuration obtained by combining together the first write port section 21AW, the transfer circuit 41, the first holding circuit 20A and the first read port section 21AR2.

In the figure, a write port AW is disabled and cannot write data when a data 2A write word line WL2 is at Hi. Between first and second inverted circuits 18A and 18B in a holding circuit 2B, the second inversion circuit 18B includes one PMOS transistor 94 and two NMOS transistors 18$c$ and 18$d$. The drain of the second NMOS transistor 18$c$ is connected to the source of the first NMOS transistor 18$d$, and the gate of the second NMOS transistor 18$c$ is connected to the data 2A write word line WL2. Moreover, the source of the second NMOS transistor 18$c$ is connected to the output of an inverter circuit INV8 for inverting the data 2A write word line WL2. The operation of this circuit will now be described.

In the memory cell of the register file of FIG. 2, when Hi is written from the write bit line, the gate length of the NMOS transistor of the inversion circuit 12 in the first holding circuit or the second holding circuit is determined by the current capacity of the corresponding PMOS transistor and the current capacity of the PMOS transistor in the write circuit connected to the bit line. Thus, the current capacity of the NMOS transistor of the inversion circuit 12 needs to be sufficiently smaller than the driving ability of the PMOS transistor for bringing the holding circuit to Hi. Normally, since a reduction in area is desired for memory cells of these register files, a dimension close to the minimum transistor width of a MOS transistor of each process generation is used. The minimum transistor width is required also for the NMOS transistor or the PMOS transistor of the inversion circuit 12. In order to satisfy the driving ability constraint while using the minimum transistor width, conventional techniques increase the gate length of the NMOS transistor. For example, transistor dimensions that satisfy the driving ability constraint with a power source voltage of 0.8 V are as follows. For the 90 nm process generation and where the transistor width of the PMOS transistor of the inversion circuit 12 is 0.3 μm and the gate length thereof is 0.1 μm, the NMOS transistor of the inversion circuit 12 is required to have a transistor width of 0.3 μm and a gate length of 1 μm.

However, in the 65 nm process generation, due to the limit in lithography, it is only possible to form a MOS transistor whose gate length is about twice as large as the minimum gate length. By connecting together ten NMOS transistors whose gate length is 0.1 μm in series, it is possible to form a transistor whose gate length is 1 μm. With this configuration, however, the area overhead will be excessive. This is because if a plurality of MOS transistors are connected in series, the diffusion width of the serial area requires a dimension that is about twice as large as the minimum gate length (0.1 μm in this case). Thus, for a series of ten transistors, there is required a diffusion width of about 0.1*2*9=1.8 μm in the transistor gate length direction, whereby the size will be significantly larger than that of a single NMOS transistor whose gate length is 1 μM.

In order to solve this problem, the present inventor has devised a memory cell as shown in FIG. 18. In the figure, when the data 2A write word line WL2 is at Hi, the NMOS transistor 18c is ON, whereby the inversion circuit 18B functions as an ordinary inversion logic circuit. When the data 2A write word line is at L, the NMOS transistor 18c is cut off, whereby the driving ability of the NMOS transistor 18c can be made to appear lower, and it is possible to easily write Hi to the holding circuit 2B. With this configuration, it is possible to realize memory cells without wastefully causing an area overhead even with advanced production processes.

Moreover, the memory cell shown in FIG. 18 is characteristic also in that the source of the NMOS transistor 18c is connected to the output of the inversion circuit INV8 of the data 2A write word line WL2 instead of connecting it directly to the ground.

Assuming that the inversion circuit INV8 of the data 2A write word line WL2 is formed by an inverter, since the output node between the NMOS transistor 18d and the PMOS transistor 94 of the inversion circuit 18B is connected to the ground via the NMOS transistors 18d and 18c and the NMOS transistor in the inversion circuit INV8 of the data 2A write word line WL2, these NMOS transistors are in a circuit configuration where three transistors are connected in series. Due to the influence of DIBL (Drain Induced Barrier Lower), the leak is reduced as the source-drain voltage is lower. The leak current ratio is 1:¼ between a single NMOS transistor and a series of two NMOS transistors, and it is 1:1/10 for a series of three NMOS transistors. Therefore, as compared with a case where the source of the NMOS transistor 18c is directly grounded, the leak current can be reduced by about 60%.

Moreover, it is not necessary to provide new NMOS transistors, but the connection is made in series with an existing NMOS transistor in the inverter INV8, thereby causing no increase in area. Note that while the inversion circuit INV8 of the data 2A write word line WL2 does not have to be an inverter circuit, but may be any other type of circuit, a greater reduction in leak current can be achieved as a larger number of NMOS transistors are connected in series with one another and connected to the ground.

Note that in a case where the frequency with which the output from the inversion circuit 18A is L is greater than the frequency with which the output from the inversion circuit 18A is H, it is more preferred that the source of the NMOS transistor 18d is connected to the output side of the inverter circuit INV8, the drain of the NMOS transistor 18d is connected to the source of the NMOS transistor 18c, and the drain of the NMOS transistor 18c is connected to the input side of the inversion circuit 18A. Then, the gate leak current can be further reduced and the number of times a read port AR is discharged can be reduced, whereby it is possible to reduce the power consumption.

Figure 19:
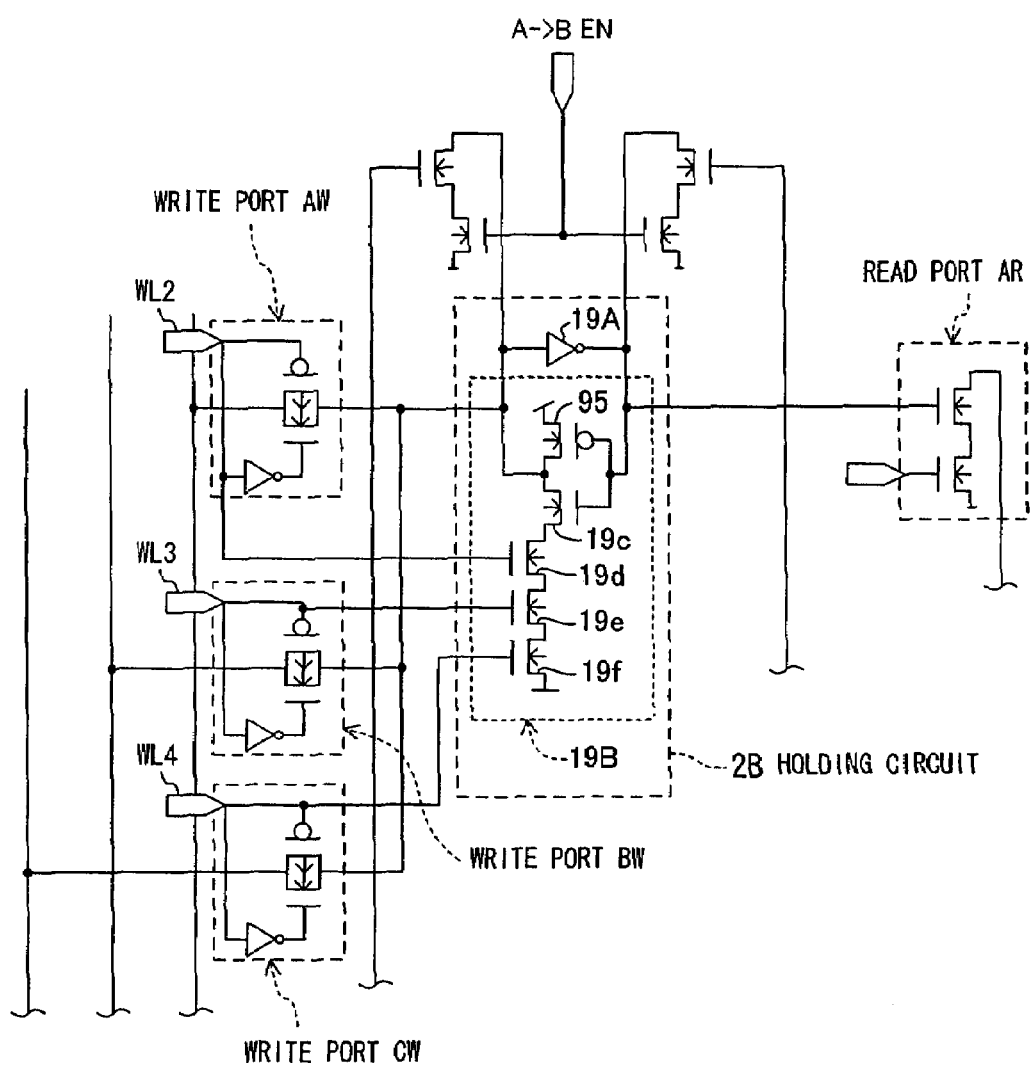
FIG. 19 shows a circuit configuration of a 1R/3W memory cell in the register file.

FIG. 19 shows yet another variation of a memory cell of a register file, which is a 3W/1R memory cell.

A second inversion circuit 19B in the holding circuit 2B is formed by one PMOS transistor 95, one first NMOS transistor 19c whose gate is connected to the gate of the transistor 95, and three second NMOS transistors 19d, 19e and 19f. The gates of the three NMOS transistors 19d, 19e and 19f are connected to the write word lines WL2, WL3 and WL4 of the corresponding three write ports. In the inversion circuit 19B of the figure, when the three data write word lines WL2 to WL4 are at Hi, all of the NMOS transistors 19c, 19d, 19e and 19f are ON, whereby the inversion circuit 19B functions as an ordinary inversion logic circuit. If any of the data 2A write word lines is at L, corresponding one of the NMOS transistors 19c, 19d, 19e and 19f is cut off, whereby it is possible to easily write Hi to the holding circuit 2B.

Moreover, the connection is such that data the 2C write word line WL4, which is connected to a second NMOS transistor that is farthest away from the first NMOS transistor 19c of the second inversion circuit 19B, i.e., the second NMOS transistor 19f, has the highest activity rate, and the other second NMOS transistors 19e and 19d have successively decreasing activity rates. With this configuration, the gate leak current is reduced. This is because, where any write word line is at L and the other write word lines are at Hi, a comparison between the source-drain voltages of the second NMOS transistors 19f, 19e and 19d shows that the NMOS transistor 19f has the lowest source-drain voltage. Since the gate leak current is in proportion to an exponential function of the source-drain voltage of the MOS transistor, the gate leak current can be most reduced by connecting the write word line with the highest activity rate to the gate of the NMOS transistor 19f, one of the four NMOS transistors of the inversion circuit 19B that is closest to the ground.

Note that in a case where the frequency with which the output from an inversion circuit 19A is L is greater than the frequency with which the output from the inversion circuit 19A is H, it is preferred that the drain of the NMOS transistor 19d is connected to the input side of the inversion circuit 19A, the drain of the NMOS transistor 19c is connected to the source of the NMOS transistor 19f, and the source of the NMOS transistor 19c is grounded. Then, the gate leak current can be further reduced and the number of times the read port AR is discharged can be reduced, whereby it is possible to reduce the power consumption.

(Application)

Figure 20A:
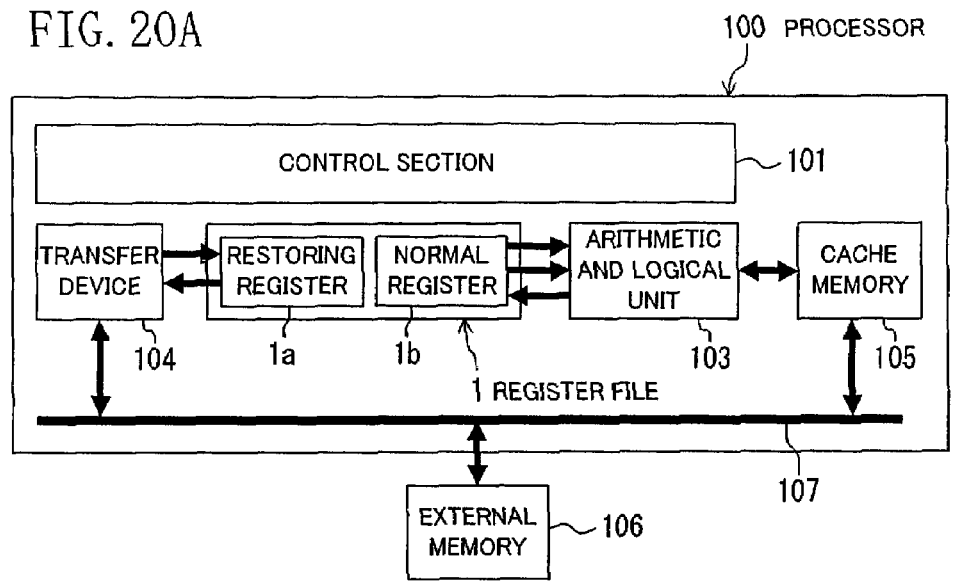
FIG. 20(a) shows an internal configuration of a processor being a specific application of the semiconductor integrated circuit.

FIG. 20(a) is a specific application of FIG. 1.

In the figure, reference numeral 100 denotes a multi-thread processor that executes a plurality of threads while switching from one to another. When a thread switching occurs, the context needs to be saved/restored to/from memory. Reference numeral 1 denotes the register file of the present invention also shown in FIG. 1, and reference numeral 1a denotes a context-saving/restoring register, which includes a plurality of second holding circuits 30B shown in FIG. 2. Reference numeral 1b denotes a normal register that is used by the processor 100 in operation, and includes a plurality of first holding circuits 20A shown in FIG. 2. Reference numeral 103 denotes an arithmetic and logical unit, which is a specific application of the functional block 2A of FIG. 2. Reference numeral 107 denotes a data bus, reference numeral 106 denotes an external memory provided outside the processor 100 and connected via the data bus 107, and reference numeral 104 denotes a transfer device for saving a context from the register 1a to the external memory 106 and restoring the context from the external memory 106 to the register 1a, which is a specific application of the functional block 2A of FIG. 2. Reference numeral 105 denotes a cache memory for storing data of the external memory 106, and 101 denotes a control section for controlling the transfer device 104, the register file 1 and the arithmetic and logical unit 103.

Figure 20B:
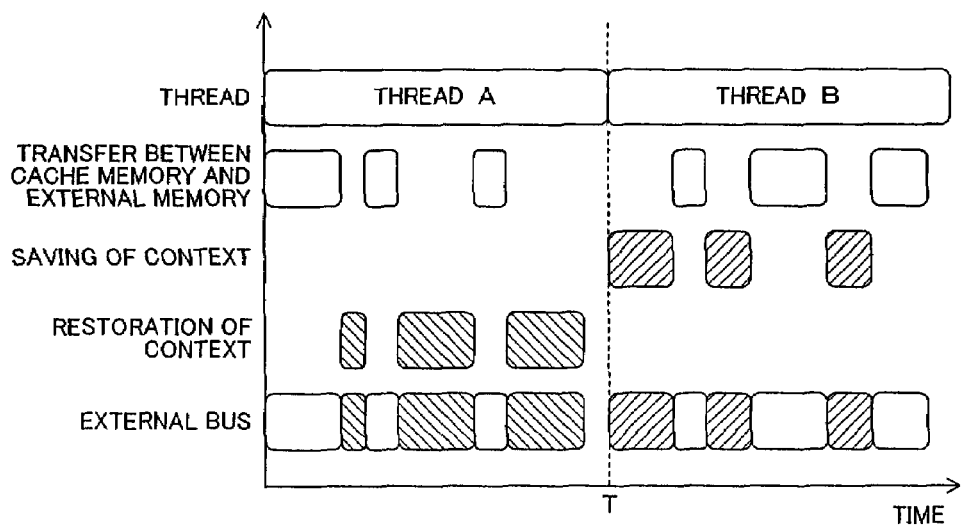
FIG. 20(b) shows thread switching timing of the processor.

FIG. 20(b) is a timing diagram showing an operation of the processor 100 switching threads from one to another. Herein, at time T, the threads are switched from a thread A to a thread B. Near time T, restoration of the context of the thread B begins. Hatched portions with hatching lines extending in the lower right direction represent the restoration of a context, where the context is restored from the external memory 106 to the register 1a by utilizing the time periods in which no data is being transferred between the cache 105 and the external memory 106. Thus, the context of the thread B is being prepared in parallel to the execution of the thread A by the processor 100. At time T, the function of the register file of the present invention is used to interchange the contents of the register 1a with the contents of the register 1b. Thus, the context of the thread A is switched to the context of the thread B.

Then, after time T, the context of the thread A is saved. Hatched portions with hatching lines extending in the lower left direction represent the saving of a context, where the context is saved from the register 1a to the external memory 106 by utilizing the time periods in which no data is being transferred between the cache 105 and the external memory 106. Thus, the context of the thread A is saved to the external memory 106 in parallel to the execution of the thread B by the processor 100.

In the processor 100 as described above, the register 1 includes the context-saving/restoring register 1a, in addition to the normal register 1b used by the processor 100 in operation, in order to hide the context-saving/restoring penalty. With this configuration, the context of the thread B can be prepared while the thread A is being executed, whereby the thread can be switched to the thread B instantly at time T. Therefore, although it is necessary to provide registers of a total capacity that is twice as large as that of the registers 1b used in operation, it is possible, by using the register file of the present invention, to realize a small area, a low power consumption, and a high-speed operation.

Figure 21:
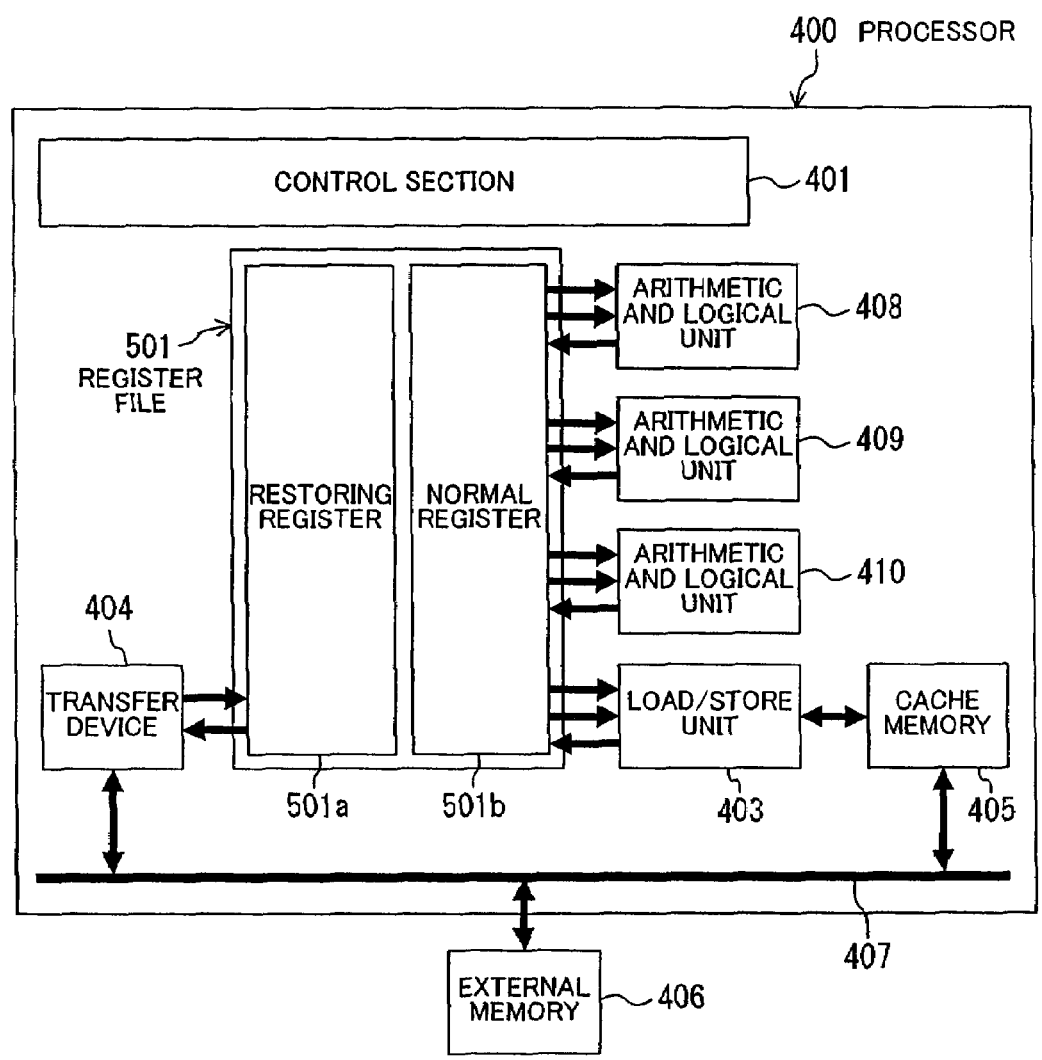
FIG. 21 shows an internal configuration of another processor being a specific application of the semiconductor integrated circuit.

FIG. 21 shows a variation of a multi-thread processor. In the figure, reference numeral 400 denotes a multi-thread processor that executes a plurality of threads while switching from one to another. In the processor 100 shown in FIG. 20, the single arithmetic and logical unit 103 is responsible for both the load/store operation and the arithmetic operation. In contrast, the processor 400 of the present example includes three arithmetic and logical units 408, 409 and 410 and one load/store unit 403. Moreover, the number of write ports is 1 and the number of read ports is 2 in each of the arithmetic and logical units 408, 409 and 410, whereas the number of write ports is 2 and the number of read ports is 1 in the load/store unit 403. Moreover, reference numeral 407 denotes a data bus, reference numeral 406 denotes an external memory provided outside the processor 400 and connected via the data bus 407, and reference numeral 404 denotes a transfer device for saving a context from a context-saving/restoring register 501a in a register file 501 to the external memory 406 and restoring the context from the external memory 406 to the register 501a. Reference numeral 405 denotes a cache memory for storing data of the external memory 406, and reference numeral 401 is a control section for controlling the transfer device 404, the register file 501, the arithmetic and logical units 408, 409 and 410, and the load/store unit 403.

A timing diagram for an operation of switching threads by the processor 400 having such a configuration is similar to that of FIG. 20(b).

In the processor 400 as described above, the register file 501 includes the context-saving/restoring register 501a, in addition to a normal register 501b used by the processor 400 in operation, in order to hide the context-saving/restoring penalty. Therefore, although it is necessary to provide registers of a total capacity that is twice as large as that of the registers 501b used in operation, it is possible, by using the register file of the present invention, to realize a small area, a low power consumption, and a high-speed operation. Particularly, in the present variation in which the number of ports of the register 501a significantly differs from that of the register 501b, the effect is more pronounced than with the case of FIG. 20.

INDUSTRIAL APPLICABILITY

As described above, the present invention is useful as a semiconductor integrated circuit having a multiport type register file in which it is possible to reduce the number of ports required for one memory cell as compared with conventional techniques and to reduce the amount of time required for accessing data, and the present invention can suitably be used in mobile telephones, IC chips or non-portable electric products, which use the semiconductor integrated circuit of the present invention.

The invention claimed is:

1. A semiconductor integrated circuit, comprising:
a holding circuit having a first inverted circuit and a second inverted circuit; and
a write port section connected to the holding circuit,
wherein an output side of the first inverted circuit is connected to an input side of the second inverted circuit,
an output side of the second inverted circuit is connected to an input side of the first inverted circuit and the write port section,
the second inverted circuit comprises a first transistor of a first conductivity type and a plurality of transistors of a second conductivity type different from the first conductivity type connected sequentially in series, and
a gate of one of the plurality of transistors is connected to the write port section.

2. The semiconductor integrated circuit of claim 1, wherein the plurality of transistors comprise a second transistor and a third transistor, the third transistor having a different MOS property including a diffusion layer concentration, a substrate voltage or a gate oxide film thickness, from the second transistor.

3. The semiconductor integrated circuit of claim 1, wherein a source of one of the plurality of transistors receives an inverted signal of a signal from a write line.

4. The semiconductor integrated circuit of claim 1, wherein the plurality of transistors including a second transistor and a third transistor.

5. The semiconductor integrated circuit of claim 4, wherein the write port section includes a third inverted circuit.

6. The semiconductor integrated circuit of claim 5, wherein the third inverted circuit outputs an inverted signal of a signal from a write line.

7. The semiconductor integrated circuit of claim 6, wherein the third inverted circuit includes a fourth transistor having the same MOS property as the plurality of transistors.

8. The semiconductor integrated circuit of claim 7, wherein an output node between the first transistor and the second transistor is grounded via the second, third and fourth transistors.

9. The semiconductor integrated circuit of claim 4, wherein a source of the second transistor is grounded.

10. The semiconductor integrated circuit of claim 1, wherein the output side of the second inverted circuit is connected to the write port section without inverting logic of output of the second inverted circuit.

11. The semiconductor integrated circuit of claim 10, wherein the output side of the second inverted circuit is directly connected to the write port section.

12. The semiconductor integrated circuit of claim 1,
wherein the gate of the one of the plurality of transistors receives a signal from the write port section.
13. The semiconductor integrated circuit of claim 1,
wherein a source of the one of the plurality of transistors receives an inverted signal of a signal from a write line.
14. The semiconductor integrated circuit of claim 12,
wherein the one of the plurality of transistors turns on when the signal from the write port section is a Low level.
15. The semiconductor integrated circuit of claim 12,
wherein a source of other one of the plurality of transistors receives an inverted signal of a signal from a write line.
16. The semiconductor integrated circuit of claim 15,
wherein the one of the plurality of transistors turns off when the signal from the write port section is a High level.
17. The semiconductor integrated circuit of claim 1,
wherein the plurality of transistors are N-channel transistors.
18. The semiconductor integrated circuit of claim 1,
wherein the write port section is disabled to write data, according to a signal from a write line to the write port section.
19. The semiconductor integrated circuit of claim 1,
wherein an output side of the first inverted circuit is connected to a read port section.
20. A semiconductor integrated circuit, comprising:
a holding circuit having a first inverted circuit and a second inverted circuit; and
a plurality of write port sections connected to the holding circuit,
wherein an output side of the first inverted circuit is connected to an input side of the second inverted circuit,
an output side of the second inverted circuit is connected to an input side of the first inverted circuit,
the second inverted circuit has a first transistor, a second transistor being different conductivity type from the first transistor and a plurality of transistors having a same conductivity type connected sequentially in series,
a gate of the first transistor is connected to a gate of the second transistor,
the plurality of transistors are disposed between a source of the second transistor and a ground power source, and
the second transistor and the plurality of transistors are the same conductivity type.
21. The semiconductor integrated circuit of claim 20,
wherein a gate of one of the plurality of transistors of which source is grounded to the ground power source receives a signal from one of the plurality of write port sections that has a highest activity rate.
22. The semiconductor integrated circuit of claim 20,
wherein the plurality of transistors includes a third transistor and a fourth transistor, the fourth transistor being more away from the output side of the second inverted circuit than the third transistor, and
one of the write port sections to which a gate of the fourth transistor is connected has an activity rate that is higher than that of one of the write port sections to which a gate of the third transistor is connected.
23. The semiconductor integrated circuit of claim 20,
wherein the output side of the second inverted circuit is connected to the plurality of write port sections.
24. The semiconductor integrated circuit of claim 20,
wherein the output side of the second inverted circuit is connected to the write port section without inverting logic of output of the second inverted circuit.
25. The semiconductor integrated circuit of claim 24,
wherein the output side of the second inverted circuit is directly connected to the write port section.
26. The semiconductor integrated circuit of claim 20,
wherein the source of the second transistor is connected to a drain of one of the plurality of transistors.
27. The semiconductor integrated circuit of claim 26,
wherein a source of other one of the plurality of transistors is connected to the ground.
28. The semiconductor integrated circuit of claim 20,
wherein each gate of the plurality of transistors is corresponded to be connected to each of the plurality of write port sections.
29. The semiconductor integrated circuit of claim 28,
wherein the one of the plurality of transistors turns on when a signal from the corresponding one of the plurality of the write port section is a Low level.
30. The semiconductor integrated circuit of claim 29,
wherein the one of the plurality of transistors turns off when the signal from the corresponding one of the plurality of the write port section is a High level.
31. The semiconductor integrated circuit of claim 20,
wherein the plurality of transistors are N-channel transistors.
32. The semiconductor integrated circuit of claim 20,
wherein at least one of the plurality of the write port section is disabled to write data, according to a signal from a write line to the one of the plurality of the write port section.
33. The semiconductor integrated circuit of claim 20,
wherein an output side of the first inverted circuit is connected to a read port section.
34. A semiconductor integrated circuit, comprising:
a first dummy circuit having a plurality of first transistors each having a same threshold voltage;
the second dummy circuit having at least one first transistor having the same threshold voltage of the first transistors of the first dummy circuit and a second transistor having a threshold voltage different from that of the first transistors;
a first power source control circuit for controlling a power source voltage to be supplied to the first transistors of the first and second dummy circuits;
a second power source control circuit for controlling a power source voltage to be supplied to the second transistor,
wherein the first power source control circuit controls the power source voltage to be supplied to the first transistors of the first and second dummy circuits based on a delayed phase of an output signal from the first dummy circuit, and
the second power source control circuit controls, after the power source voltage to be supplied to the first transistors of the first and second dummy circuits is controlled, the power source voltage to be supplied to the second transistor based on a delayed phase of an output signal from the second dummy circuit.
35. The semiconductor integrated circuit of claim 34,
wherein the first and second dummy circuits are placed in a function block,
the semiconductor integrated circuit comprises:
a first counter circuit for comparing the delayed phase of the output signal from the first dummy circuit with a reference clock to be an operation clock of the function block, and a second counter circuit for comparing the delayed phase of the output signal from the second dummy circuit with the reference clock, the first power source control circuit controls the power source voltage to be supplied to the first transistors of the first and second dummy circuits based on an output of the first counter circuit, and the second power source control circuit controls the power source voltage to be supplied to the second transistor based on an output of the second counter circuit.

36. The semiconductor integrated circuit of claim 35, wherein the function block is a register file.

* * * * *